United States Patent
Takizawa et al.

(10) Patent No.: US 7,112,616 B2
(45) Date of Patent: Sep. 26, 2006

(54) TWO-PHOTON ABSORBING POLYMERIZABLE COMPOSITION AND POLYMERIZATION PROCESS THEREOF

(75) Inventors: Hiroo Takizawa, Kanagawa (JP); Masaharu Akiba, Kanagawa (JP); Takeharu Tani, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 137 days.

(21) Appl. No.: 10/804,144

(22) Filed: Mar. 19, 2004

(65) Prior Publication Data

US 2004/0204513 A1     Oct. 14, 2004

(30) Foreign Application Priority Data

Mar. 25, 2003 (JP) ............... P.2003-082730
Mar. 25, 2003 (JP) ............... P.2003-082732

(51) Int. Cl.
*C08F 2/46* (2006.01)
*G03C 1/73* (2006.01)

(52) U.S. Cl. ............... 522/8; 522/12; 522/16; 522/24; 522/25; 522/26; 522/29; 522/2; 430/270.1; 430/280.1; 430/281.1

(58) Field of Classification Search ............ 522/8, 522/12, 16, 24, 25, 26, 29
See application file for complete search history.

(56) References Cited

U.S. PATENT DOCUMENTS

| | | | | |
|---|---|---|---|---|
| 3,615,545 | A | * | 10/1971 | Kalenda ............. 430/518 |
| 3,976,493 | A | * | 8/1976 | Borror et al. ......... 430/579 |
| 4,282,309 | A | * | 8/1981 | Laridon et al. ....... 430/281.1 |
| 4,471,470 | A | * | 9/1984 | Swainson et al. ..... 365/127 |
| 6,852,766 | B1 | * | 2/2005 | DeVoe ............. 522/25 |
| 7,005,229 | B1 | * | 2/2006 | Nirmal et al. ....... 430/270.1 |
| 2001/0003032 | A1 | * | 6/2001 | Harada et al. ....... 430/302 |
| 2003/0052311 | A1 | * | 3/2003 | Inagaki et al. ....... 252/600 |

OTHER PUBLICATIONS

Brian H. Cumpston et al., "Two-photon polymerization initiators for three-dimensional optical data storage and microfabrication", Nature, vol. 398, 1999, pp. 51-54.

Kevin D. Belfield et al., "Multiphoton-absorbing organic materials for microfabrication, emerging optical applications and non-destructive three-dimensional imaging", J. Phys. Org. Chem., vol. 13, 2000, pp. 837-849.

Chengde Li et al., "Two-photon microstructure-polymerization initiated by a coumarin derivative/iodonium salt system", Chem. Phys. Lett., vol. 340, 2001, pp. 444-448.

Kevin D. Belfield et al., "Near-IR Two-Photon Photoinitiated Polymerization Using a Fluorone/Amine Initiating System", J. Am. Chem. Soc., vol. 122, 2000, pp. 1217-1218.

Shoji Maruo et al., "Three-dimensional microfabrication with two-photon-absorbed photopolymerization", Oppt. Lett., vol. 22, 1997, pp. 132-134.

* cited by examiner

*Primary Examiner*—Susan Berman
(74) *Attorney, Agent, or Firm*—Sughrue Mion, PLLC

(57) ABSTRACT

A two-photon absorbing polymerizable composition contains at least a two-photon absorbing compound, a polymerization initiator and a polymerizable compound, the composition being photopolymerizable upon non-resonant two-photon absorption, wherein the two-photon absorbing compound is a methine dye containing a compound represented by the formula (1):

$$X^2\!-\!(\!-\!CR^4\!=\!CR^3\!-\!)_m\!-\!\underset{\underset{O}{\|}}{C}\!-\!(\!-\!CR^1\!=\!CR^2\!-\!)_n\!-\!X^1 \quad (1)$$

$$-CR^5=\!\!\underset{\underset{R^6}{|}}{N}\!\!\diagdown\!\!Z^1 \quad (2)$$

wherein $R^1$ to $R^5$ each represents a hydrogen atom or a substituent and some of $R^1$ to $R^4$ may combine with each other to form a ring; n and m each independently represents an integer of 0 to 4, provided that n and m are not 0 at the same time; $X^1$ and $X^2$ each represents an aryl group, a heterocyclic group or a group represented by formula (2); $R^6$ represents a hydrogen atom, an alkyl group, an alkenyl group, an aryl group or a heterocyclic group, and $Z^1$ represents an atomic group for forming a 5- or 6-membered ring.

15 Claims, No Drawings

TWO-PHOTON ABSORBING POLYMERIZABLE COMPOSITION AND POLYMERIZATION PROCESS THEREOF

FIELD OF THE INVENTION

The present invention relates to a material of expressing a non-linear optical effect, more specifically, the present invention relates to an organic non-linear optical material-containing two-photon absorbing polymerizable composition having a large non-resonant two-photon absorbing cross-sectional area and capable of undergoing efficient photopolymerization from the excited state generated by non-resonant two-photon absorption.

BACKGROUND OF THE INVENTION

In general, the non-linear optical effect means a non-linear optical response proportional to the square, cube or higher power of photoelectric field applied. Known examples of the secondary non-linear optical effect proportional to the square of photoelectric field applied include second harmonic generation (SHG), optical rectification, photorefractive effect, Pockels effect, parametric amplification, parametric oscillation, light sum frequency mixing and light difference frequency mixing. Examples of the ternary non-linear optical effect proportional to the cube of photoelectric filed applied include third harmonic generation (THG), optical Kerr effect, self-induced refractive index change and two-photon absorption.

As the non-linear optical material of exhibiting these non-linear optical effects, a large number of inorganic materials have been heretofore found. However, inorganic materials can be hardly used in practice because so-called molecular design so as to optimize desired non-linear optical characteristics or various properties necessary for the production of a device is difficult. On the other hand, organic compounds can realize not only optimization of desired non-linear optical characteristics by the molecular design but also control of other various properties and therefore, the probability of its practical use is high. Thus, organic compounds are attracting attention as a promising non-linear optical material.

In recent years, among non-linear optical characteristics of the organic compound, ternary non-linear optical effects, particularly, non-resonant two-photon absorption, are being taken notice of. The two-photon absorption is a phenomenon such that a compound is excited by simultaneously absorbing two photons. In the case where the two-photon absorption occurs in the energy region having no (linear) absorption band of the compound, this is called non-resonant two-photon absorption. In the following, even when not particularly specified, two-photon absorption indicates non-resonant two-photon absorption.

The non-resonant two-photon absorption efficiency is proportional to the square of photoelectric field applied (square-law characteristic of two-photon absorption). Therefore, when a laser is irradiated on a two-dimensional plane, two-photon absorption takes place only in the position having a high electric field strength at the center part of laser spot and utterly no two-photon absorption occurs in the portion having a weak electric field strength in the periphery. On the other hand, in a three-dimensional space, two-photon absorption occurs only in the region having a large electric field strength at the focus where the laser rays are converged through a lens, and two-photon absorption does not take place at all in the off-focus region because the electric field strength is weak. As compared with the linear absorption where excitation occurs in all positions proportionally to the strength of photoelectric field applied, in the non-resonant two-photon absorption, excitation occurs only at one point inside the space by virtue of the square-law characteristic and therefore, the space resolution is remarkably enhanced.

Usually, in the case of inducing non-resonant two-photon absorption, a short pulse laser in the near infrared region having a wavelength longer than the wavelength region where the (linear) absorption band of a compound is present, and not having the absorption of the compound is used in many cases. Since a near infrared ray in a so-called transparent region is used, the excitation light can reach the inside of a sample without being absorbed or scattered and one point inside the sample can be excited with very high space resolution due to the square-law characteristic of non-resonant two-photon absorption.

Therefore, if polymerization can be caused by using the excitation energy obtained upon non-resonant two-photon absorption, polymerization can be brought about at an arbitrary position in a three-dimensional space and this enables application to a three-dimensional optical recording medium, a fine three-dimensional stereo-lithography material and the like, which are considered as an ultimate high-density recording medium.

Examples of the technique of performing two-photon photopolymerization by using a non-resonant two-photon absorbing compound and applying it to stereolithography and the like are described in B. H. Cumpston et al., *Nature*, Vol. 398, page 51 (1999) [Non-Patent Document 1], K. D. Belfield et al., *J. Phys. Org. Chem.*, Vol. 13, page 837 (2000) [Non-Patent Document 2], C. Li et al., *Chem. Phys. Lett.*, Vol. 340, page 444 (2001) [Non-Patent Document 3], K. D. Belfield et al., *J. Am. Chem. Soc.*, Vol. 122, page 1217 (2000) [Non-Patent Document 4], S. Maruo et al., *Oppt. Lett.*, Vol. 22, page 132 (1997) [Non-Patent Document 5].

However, these techniques have the following problems:
1) the two-photon absorbing cross-sectional area of the two-photon absorbing compound is small,
2) two photons are absorbed directly into a polymerization initiator having a very low two-photon absorbing cross-sectional area, without using a two-photon absorbing compound,
3) a polymerization initiator is not used,
4) the polymerization initiator, if used, has bad matching with the two-photon absorbing compound, and the like. In this way, a high-efficiency two-photon absorbing compound and an appropriate polymerization initiator are not used and this gives rise to problems in practice, that is, the polymerization efficiency is bad and for performing stereolithography or the like by polymerization, a strong laser must be irradiated for a long period of time.

[Non-Patent Document 1]
B. H. Cumpston et al., *Nature*, Vol. 398, page 51 (1999)
[Non-Patent Document 2]
K. D. Belfield et al., *J. Phys. Org. Chem.*, Vol. 13, page 837 (2000)
[Non-Patent Document 3]
C. Li et al., *Chem. Phys. Lett.*, Vol. 340, page 444 (2001)
[Non-Patent Document 4]
K. D. Belfield et al., *J. Am. Chem. Soc.*, Vol. 122, page 1217 (2000)
[Non-Patent Document 5]
S. Maruo et al., *Oppt. Lett.*, Vol. 22, page 132 (1997)

As described above, if polymerization can be caused by using the excitation energy obtained upon non-resonant two-photon absorption, polymerization can be brought about at an arbitrary position in a three-dimensional space with very high space resolution and this enables application to a three-dimensional optical recording medium, a fine three-dimensional stereolithography material and the like, which are considered as an ultimate high-density recording medium. However, two-photon absorbing compounds usable at present are low in the two-photon absorbing ability and polymerization initiating ability and also have bad matching with a polymerization initiator and therefore, the polymerization efficiency is extremely low. As a result, a very high-output laser is necessary as a light source and the recording takes a long time.

In particular, for use in a three-dimensional optical recording medium, it is essential to establish a two-photon absorbing polymerizable composition capable of undergoing photopolymerization with high sensitivity and thereby attain a high transfer rate.

SUMMARY OF THE INVENTION

An object of the present invention is to provide a two-photon absorbing polymerizable composition capable of undergoing photopolymerization with high sensitivity and for this purpose, provide a material capable of absorbing two photons with high efficiency, namely, a material having a large two-photon absorbing cross-sectional area, and also a polymerization initiator and a polymerizable compound, which can efficiently bring about polymerization from the excitation energy of the material.

As a result of intensive investigations, the present inventors have succeeded in finding a material capable of absorbing two photons with high efficiency, namely, a material having a large two-photon absorbing cross-sectional area, and also a polymerization initiator capable of efficiently bringing about polymerization from the excitation energy of the material.

That is, the object of the present invention can be attained by the following techniques.

(1) A two-photon absorbing polymerizable composition comprising at least a two-photon absorbing compound, a polymerization initiator and a polymerizable compound, the composition being photopolymerizable upon non-resonant two-photon absorption, wherein the two-photon absorbing compound is a methine dye.

(2) The two-photon absorbing polymerizable composition as described in (1), wherein the methine dye is a cyanine dye, a merocyanine dye, an oxonol dye or a dye compound represented by the following formula (1):

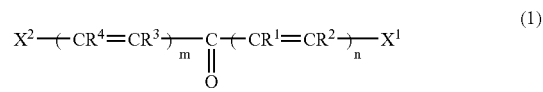

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, the plurality of $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

(3) The two-photon absorbing polymerizable composition as described in (2), wherein the methine dye is a compound represented by formula (1), a cyanine dye represented by the following formula (3), a merocyanine dye represented by formula (4) or an oxonol dye represented by formula (5):

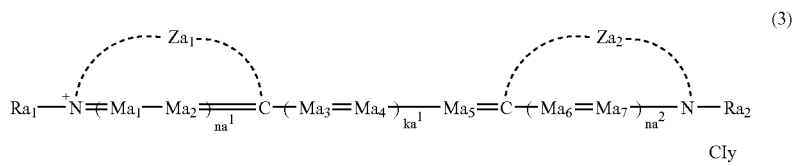

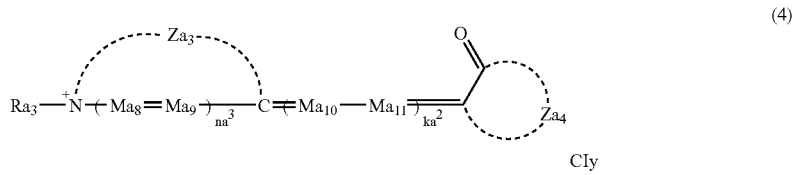

-continued

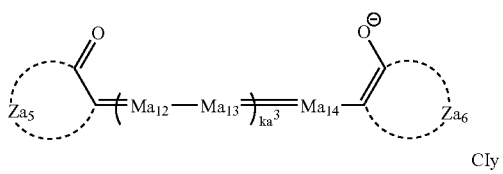

(5)

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

(4) The two-photon absorbing polymerizable composition as described in (2) or (3), wherein in the compound represented by formula (1), $X^1$ and $X^2$ each is a group represented by formula (2).

(5) The two-photon absorbing polymerizable composition as described in (4), wherein in the compound represented by formula (1), $R^1$ and $R^3$ are linked to form a cyclopentanone ring together with the carbonyl group.

(6) The two-photon absorbing polymerizable composition as described in (2) to (5), wherein in the compound represented by formula (1), $X^1$ and $X^2$ each is an aryl group.

(7) The two-photon absorbing polymerizable composition as described in (6), wherein in the compound represented by formula (1), $X^1$ and $X^2$ each is an aryl group with the 4-position being substituted by an amino group.

(8) The two-photon absorbing polymerizable composition as described in any one of (2) to (5), wherein in the compound represented by formula (1), $X^1$ and $X^2$ each is a group represented by formula (2).

(9) The two-photon absorbing polymerizable composition as described in (8), wherein in the compound represented by formula (1), $X^1$ and $X^2$ each is a group represented by formula (2), $R^6$ is an alkyl group, and the ring formed by $Z^1$ is an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring or a quinoline ring.

(10) The two-photon absorbing polymerizable composition as described in (8), wherein in the compound represented by formula (1), $X^1$ and $X^2$ each is a group represented by formula (2), $R^6$ is an alkyl group, and the ring formed by $Z^1$ is an indolenine ring, an azaindolenine ring, a benzothiazole ring, a benzoxazole ring or a benzimidazole ring.

(11) The two-photon absorbing polymerizable composition as described in any one of (1) to (10), wherein the two-photon absorbing compound contains at least one hydrogen bonding group.

(12) The two-photon absorbing polymerizable composition as described in (11), wherein the hydrogen bonding group is —COOH group or —$CONH_2$ group.

(13) The two-photon absorbing polymerizable composition as described in any one of (1) to (12), wherein the polymerization initiator is 1) a ketone-base polymerization initiator, 2) an organic peroxide-base polymerization initiator, 3) a bisimidazole-base polymerization initiator, 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator, 8) a triphenylalkylborate-base polymerization initiator, 9) a diaryliodonium organic boron complex-base polymerization initiator, 10) a sulfonium organic boron complex-base polymerization initiator, 11) a cationic two-photon absorbing compound organic boron complex-base polymerization initiator, 12) an anionic two-photon absorbing compound onium salt complex-base polymerization initiator, 13) a metal arene complex-base polymerization initiator or 14) a sulfonic acid ester-base polymerization initiator.

(14) The two-photon absorbing polymerizable composition as described in (13), wherein the polymerization initiator is 1) a ketone-base polymerization initiator, 3) a bisimidazole-base polymerization initiator, 4) a trihalomethyl-substituted triazine-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(15) The two-photon absorbing polymerizable composition as described in any one of (1) to (14), wherein the polymerization initiator contains a polymerization initiator of generating at least one radical and the polymerizable compound contains a radical polymerizable compound of undergoing polymerization under the action of at least one radical.

(16) The two-photon absorbing polymerizable composition as described in (15), wherein the radical polymerization initiator of generating at least one radical is 1) a ketone-base polymerization initiator, 2) an organic peroxide-base polymerization initiator, 3) a bisimidazole-base polymerization initiator, 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator, 8) a triphenylalkylborate-base polymerization initiator, 9) a diaryliodonium organic boron complex-base polymerization initiator, 10) a sulfonium organic boron complex-base polymerization initiator, 11) a cationic two-photon absorbing compound organic boron complex-base polymerization initiator, 12) an anionic two-photon absorbing compound onium salt complex-base polymerization initiator or 13) a metal arene complex-base polymerization initiator.

(17) The two-photon absorbing polymerizable composition as described in (16), wherein the radical polymerization initiator of generating at least one radical is 1) a ketone-base polymerization initiator, 3) a bisimidazole-base polymerization initiator, 4) a trihalomethyl-substituted triazine-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(18) The two-photon absorbing polymerizable composition as described in (16), wherein the radical polymerization initiator of generating at least one radical is 3) a bisimidazole-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(19) The two-photon absorbing polymerizable composition as described in any one of (1) to (13), wherein the polymerization initiator contains a polymerization initiator of generating an acid without generating at least one radical and the polymerizable compound contains a cationic polymerizable compound of undergoing polymerization under the action of at least one acid.

(20) The two-photon absorbing polymerizable composition as described in (19), wherein the polymerization initiator of generating an acid without generating at least one radical is 14) a sulfonic acid ester-base polymerization initiator.

(21) The two-photon absorbing polymerizable composition as described in any one of (1) to (14), wherein the polymerization initiator contains a polymerization initiator of generating both at least one radical and at least one acid and the polymerizable compound contains either one or both of a radical polymerizable compound of undergoing polymerization under the action of at least one radical and a cationic polymerizable compound of undergoing polymerization under the action of at least one acid.

(22) The two-photon absorbing polymerizable composition as described in (21), wherein the radical polymerization initiator of generating both at least one radical and at least one acid is 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator or 13) a metal arene complex-base polymerization initiator.

(23) The two-photon absorbing polymerizable composition as described in (21), wherein the radical polymerization initiator of generating both at least one radical and at least one acid is 6) a diaryliodonium salt-base polymerization initiator or 7) a sulfonium salt-base polymerization initiator.

(24) A two-photon absorbing polymerizable composition comprising at least a two-photon absorbing compound and a polymerizable compound, the composition being photopolymerizable upon non-resonant two-photon absorption, wherein the two-photon absorbing compound is a methine dye described in (2).

(25) The two-photon absorbing polymerizable composition as described in (24), wherein the two-photon absorbing compound is a cyanine dye represented by formula (3), a merocyanine dye represented by formula (4), an oxonol dye represented by formula (5), and a compound represented by formula (1) where $X^1$ and $X^2$ each is a group represented by formula (2).

(26) A polymerization process comprising irradiating the two-photon absorbing polymerizable composition described in (1) to (25) with a laser ray at a wavelength being longer than the linear absorption band of the two-photon absorbing compound and not having linear absorption, and causing a polymerization reaction by using the two-photon absorption induced.

(27) A three-dimensional optical recording medium comprising the two-photon absorbing polymerizable composition described in (1) to (25).

(28) A stereolithography composition comprising the two-photon absorbing polymerizable composition described in (1) to (25).

(29) A two-photon absorbing polymerizable composition comprising at least two-photon absorbing compound, a polymerization initiator and a polymerizable compound, said composition being photopolymerizable upon non-resonant two-photon absorption, wherein the polymerization initiator is 1) an organic peroxide-base polymerization initiator, 2) a bisimidazole-base polymerization initiator, 3) a trihalomethyl-substituted triazine-base polymerization initiator, 4) a diazonium salt-base polymerization initiator, 5) a sulfonium salt-base polymerization initiator, 6) a borate-base polymerization initiator, 7) a diaryliodonium organic boron complex-base polymerization initiator, 8) a sulfonium organic boron complex-base polymerization initiator, 9) a cationic two-photon absorbing compound organic boron complex-base polymerization initiator, 10) an anionic two-photon absorbing compound onium salt complex-base polymerization initiator, 11) a metal arene complex-base polymerization initiator or 12) a sulfonic acid ester-base polymerization initiator.

DETAILED DESCRIPTION OF THE INVENTION

The two-photon absorbing polymerizable composition of the present invention is described in detail below.

The two-photon absorbing polymerizable composition of the present invention comprises a two-photon absorbing compound, a radical or cationic polymerization initiator of generating a radical or an acid by using the excitation energy of the two-photon absorbing compound, and a polymerizable compound of undergoing polymerization under the action of a radial or a cation, where additives such as binder, chain transfer agent, heat stabilizer, plasticizer and solvent are used, if desired.

These components are described in detail below.

The two-photon absorbing compound in the two-photon absorbing polymerizable composition of the present invention is described below.

The two-photon absorbing compound is a compound of undergoing non-resonant two-photon absorption (a phenomenon that two photons are simultaneously absorbed in the energy region having no (linear) absorption band of the compound to cause excitation).

The two-photon absorbing compound is preferably an organic compound.

In the present invention, when a specific moiety is called "a group", unless otherwise indicated, this means that the group may or may not be substituted by one or more (up to the maximum possible number) substituent. For example, "an alkyl group" means a substituted or unsubstituted alkyl group. The substituent which can be used for the compound in the present invention may be any substituent irrespective of the presence or absence of substituent.

In the present invention, when a specific moiety is called "a ring" or when "a ring" is contained in "a group", unless otherwise indicated, the ring may be a monocyclic ring or a condensed ring or may or may not be substituted.

For example, "an aryl group" may be a phenyl group or a naphthyl group or may be a substituted phenyl group.

The two-photon absorbing compound for use in the present invention is more preferably an organic dye (dye). Incidentally, the dye as used herein is a generic term of compounds having a part of the absorption in the visible region (400 to 700 nm) or near infrared region (700 to 2,000 nm).

The dye for use in the present invention may be any dye, but examples thereof include cyanine dyes, hemicyanine dyes, streptocyanine dyes, styryl dyes, merocyanine dyes, trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, xanthene dyes, azo dyes, azomethine dyes, spiro compounds, metallocene dyes, fluorenone dyes, flugido dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes and metal complex dyes.

Among these, preferred are cyanine dyes, hemicyanine dyes, streptocyanine dyes, styryl dyes, merocyanine dyes, trinuclear merocyanine dyes, tetranuclear merocyanine dyes, rhodacyanine dyes, oxonol dyes, squalium dyes, arylidene dyes, triphenylmethane dyes, xanthene dyes, porphyrin dyes, phthalocyanine dyes and metal complex dyes.

The two-photon absorbing compound for use in the present invention is preferably a methine dye.

The methine dye for use in the present invention may be any methine dye, but examples thereof include cyanine dyes, hemicyanine dyes, streptocyanine dyes, styryl dyes, merocyanine dyes, trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, arylidene dyes and polyene dyes.

Among these methine dyes, preferred are cyanine dyes, hemicyanine dyes, streptocyanine dyes, styryl dyes, merocyanine dyes, trinuclear merocyanine dyes, tetranuclear merocyanine dyes, rhodacyanine dyes, oxonol dyes, squalium dyes and arylidene dyes, more preferred are cyanine dyes, merocyanine dyes and oxonol dyes.

These dyes are described in detail, for example, in F. M. Harmer, *Heterocyclic Compounds—Cyanine Dyes and Related Compounds*, John Wiley & Sons, New York, London (1964), D. M. Sturmer, *Heterocyclic Compounds—Special topics in heterocyclic chemistry*, Chap. 18, Section 14, pp. 482–515, John Wiley & Sons, New York, London (1977), and *Rodd's Chemistry of Carbon Compounds*, 2nd ed., Vol. IV, Part B, Chap. 15, pp. 369–422, Elsevier Science Publishing Company Inc., New York (1977).

Specific examples of the cyanine, merocyanine and oxonol dyes include those described in F. M. Harmer, *Heterocyclic Compounds—Cyanine Dyes and Related Compounds*, John Wiley & Sons, New York, London (1964).

As for the formulae of the cyanine and merocyanine dyes, formulae (XI) and (XII) described at pages 21 and 22 of U.S. Pat. No. 5,340,694 are preferred (however, the numbers represented by n12 and n15 are not limited and each is an integer of 0 or more (preferably from 0 to 4)).

When the two-photon absorbing dye for use in the present invention is a cyanine dye, the cyanine dye is preferably represented by formula (3).

In formula (3), $Za_1$ and $Za_2$ each represents an atomic group for forming a 5- or 6-membered nitrogen-containing heterocyclic ring. Preferred examples of the 5- or 6-membered nitrogen-containing heterocyclic ring formed include oxazole nuclei having a carbon atom number (hereinafter referred to as "a C number") of 3 to 25 (e.g., 2-3-methyloxazolyl, 2-3-ethyloxazolyl, 2-3,4-diethyloxazolyl, 2-3-methylbenzoxazolyl, 2-3-ethylbenzoxazolyl, 2-3-sulfoethylbenzoxazolyl, 2-3-sulfopropylbenzoxazolyl, 2-3-methylthioethylbenzoxazolyl, 2-3-methoxyethylbenzoxazolyl, 2-3-sulfobutylbenzoxazolyl, 2-3-methyl-β-naphthoxazolyl, 2-3-methyl-α-naphthoxazolyl, 2-3-sulfopropyl-β-naphthoxazolyl, 2-3-sulfopropyl-β-naphthoxazolyl, 2-3-(3-naphthoxyethyl)benzoxazolyl, 2-3,5-dimethylbenzoxazolyl, 2-6-chloro-3-methylbenzoxazolyl, 2-5-bromo-3-methylbenzoxazolyl, 2-3-ethyl-5-methoxybenzoxazolyl, 2-5-phenyl-3-sulfopropylbenzoxazolyl, 2-5-(4-bromophenyl)-3-sulfobutylbenzoxazolyl, 2-3-dimethyl-5,6-dimethylthiobenzoxazolyl), thiazole nuclei having a C number of 3 to 25 (e.g., 2-3-methylthiazolyl, 2-3-ethylthiazolyl, 2-3-sulfopropylthiazolyl, 2-3-sulfobutylthiazolyl, 2-3,4-dimethylthiazolyl, 2-3,4,4-trimethylthiazolyl, 2-3-carboxyethylthiazolyl, 2-3-methylbenzothiazolyl, 2-3-ethylbenzothiazolyl, 2-3-butylbenzothiazolyl, 2-3-sulfopropylbenzothiazolyl, 2-3-sulfobutylbenzothiazolyl, 2-3-methyl-β-naphthothiazolyl, 2-3-sulfopropyl-γ-naphthothiazolyl, 2-3-(1-naphthoxyethyl)benzothiazolyl, 2-3,5-dimethylbenzothiazolyl, 2-6-chloro-3-methylbenzothiazolyl, 2-6-iodo-3-ethylbenzothiazolyl, 2-5-bromo-3-methylbenzothiazolyl, 2-3-ethyl-5-methoxybenzothiazolyl, 2-5-phenyl-3-sulfopropylbenzothiazolyl, 2-5-(4-bromophenyl)-3-sulfobutylbenzothiazolyl, 2-3-dimethyl-5,6-dimethylthiobenzothiazolyl), imidazole nuclei having a C number of 3 to 25 (e.g., 2-1,3-diethylimidazolyl, 2-1,3-dimethylimidazolyl, 2-1-methylbenzimidazolyl, 2-1,3,4-triethylimidazolyl, 2-1,3-diethylbenzimidazolyl, 2-1,3,5-trimethylbenzimidazolyl, 2-6-chloro-1,3-dimethylbenzimidazolyl, 2-5,6-dichloro-1,3-diethylbenzimidazolyl, 2-1,3-disulfopropyl-5-cyano-6-chlorobenzimidazolyl), indolenine nuclei having a C number of 10 to 30 (e.g., 3,3-dimethylindolenine), quinoline nuclei having a C number of 9 to 25 (e.g., 2-1-methylquinolyl, 2-1-ethylquinolyl, 2-1-methyl-6-chloroquinolyl, 2-1,3-diethylquinolyl, 2-1-methyl-6-methylthioquinolyl, 2-1-sulfopropylquinolyl, 4-1-methylquinolyl, 4-1-sulfoethylquinolyl, 4-1-methyl-7-chloroquinolyl, 4-1,8-diethylquinolyl, 4-1-methyl-6-methylthioquinolyl, 4-1-sulfopropylquinolyl), selenazole nuclei having a C number of 3 to 25 (e.g., 2-3-methylbenzoselenazolyl), pyridine nuclei having a C number of 5 to 25 (e.g., 2-pyridyl), thiazoline nuclei, oxazoline nuclei, selenazoline nuclei, tetrazoline nuclei, tetrazole nuclei, benzotellurazole nuclei, imidazoline nuclei, imidazo[4,5-quinoxaline] nuclei, oxadiazole nuclei, thiadiazole nuclei, tetrazole nuclei and pyrimidine nuclei.

The heterocyclic ring may be substituted and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenyl-carbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenyl-carbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

The heterocyclic ring may be further condensed with another ring. Preferred examples of the ring with which the heterocyclic ring is condensed include a benzene ring, a benzofuran ring, a pyridine ring, a pyrrole ring, an indole ring and a thiophene ring.

The 5- or 6-membered nitrogen-containing heterocyclic ring formed by $Za_1$ and $Za_2$ is more preferably an oxazole nucleus, an imidazole nucleus, a thiazole nucleus or an indolenine ring, still more preferably an oxazole nucleus, an imidazole nucleus or an indolenine ring, and most preferably an oxazole nucleus.

$Ra_1$ and $Ra_2$ each independently represents a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_1$ to $Ma_7$ each represents a methine group and the methine group may have a substituent (preferred examples of the substituent are the same as examples of the substituent on $Za_1$ and $Za_2$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_1$ to $Ma_7$ each is preferably an unsubstituted methine group or an alkyl group (preferably having a C number of 1 to 6)-substituted methine group, more preferably an unsubstituted methine group, an ethyl group-substituted methine group or a methyl group-substituted methine group.

$Ma_1$ to $Ma_7$ may combine with each other to form a ring and preferred examples of the ring formed include a cyclohexene ring, a cyclopentene ring, a benzene ring and a thiophene ring.

$na^1$ and $na^2$ each is 0 or 1, preferably both are 0.

$ka^1$ represents an integer of 0 to 3, preferably 1 to 3, more preferably 1 or 2.

When $ka^1$ is 2 or more, multiple $Ma_3$s or $Ma_4$s may be the same or different.

CI represents an ion for neutralizing the electric charge and y represents a number necessary for the neutralization of electric charge.

When the two-photon absorbing compound for use in the present invention is a merocyanine dye, the merocyanine dye is preferably represented by formula (4).

In formula (1), $Za_3$ represents an atomic group for forming a 5- or 6-membered nitrogen-containing heterocyclic ring (preferred examples are the same as those for $Za_1$ and $Za_2$) and the heterocyclic group may be substituted (preferred examples of the substituent are the same as examples of the substituent on $Za_1$ and $Za_2$) or may be further condensed with another ring.

The 5- or 6-membered nitrogen-containing heterocyclic ring formed by $Za_3$ is more preferably an oxazole nucleus, an imidazole nucleus, a thiazole nucleus or an indolenine ring, still more preferably an oxazole nucleus or an indolenine ring.

$Za_4$ represents an atomic group for forming a 5- or 6-membered ring. The ring formed by $Za_4$ is a moiety generally called an acidic nucleus which is defined in James (compiler), *The Theory of the Photographic Process*, 4th ed., page 198, Macmillan (1977). The ring formed by $Za_4$ is preferably a nucleus such as 2-pyrazolon-5-one, pyrazolidine-3,5-dione, imidazolin-5-one, hydantoin, 2- or 4-thiohydantoin, 2-iminooxazolidin-4-one, 2-oxazolin-5-one, 2-thiooxazoline-2,4-dione, isorhodanine, rhodanine, indane-1,3-dione, thiophen-3-one, thiophen-3-one-1,1-dioxide, indolin-2-one, indolin-3-one, 2-oxoindazolium, 5,7-dioxo-6,7-dihydrothiazolo[3,2-a]pyrimidine, 3,4-dihydroisoquinolin-4-one, 1,3-dioxane-4,6-dione, barbituric acid, 2-thiobarbituric acid, coumarin-2,4-dione, indazolin-2-one, pyrido[1,2-a]pyrimidine-1,3-dione, pyrazolo[1,5-b]quinazolone or pyrazolopyridone.

The ring formed by $Za_4$ is more preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, still more preferably pyrazolidine-3,5-dione, indane-1,3-dione, 1,3-dioxane-4,6-dione, barbituric acid or 2-thiobarbituric acid, and most preferably pyrazolidine-3,5-dione, barbituric acid or 2-thiobarbituric acid.

The ring formed by $Za_4$ may be substituted (preferred examples of the substituent are the same as examples of the substituent on $Za_3$) and the substituent is preferably an alkyl group, an aryl group, a heterocyclic group, a halogen atom, a cyano group, a carboxyl group, a sulfo group, an alkoxy group, a sulfamoyl group, a carbamoyl group or an alkoxycarbonyl group.

The heterocyclic ring may be further condensed with another ring. Preferred examples of the ring with which the heterocyclic ring is condensed include a benzene ring, a benzofuran ring, a pyridine ring, a pyrrole ring, an indole ring and a thiophene ring.

Each $Ra_3$ independently represents a hydrogen atom, an alkyl group, an alkenyl group, an aryl group or a heterocyclic group (preferred examples of these groups are the same as those for $Ra_1$ and $Ra_2$), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_8$ to $Ma_{11}$ each represents a methine group and the methine group may have a substituent (preferred examples of the substituent are the same as examples of the substituent on $Za_1$ and $Za_2$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_8$ to $Ma_{11}$ each is preferably an unsubstituted methine group or an alkyl group (preferably having a C number of 1 to 6)-substituted methine group, more preferably an unsubstituted methine group, an ethyl group-substituted methine group or a methyl group-substituted methine group.

$Ma_8$ to $Ma_{11}$ may combine with each other to form a ring and preferred examples of the ring formed include a cyclohexene ring, a cyclopentene ring, a benzene ring and a thiophene ring.

$na^3$ is 0 or 1, preferably 0.

$ka^2$ represents an integer of 0 to 8, preferably 0 to 4, more preferably 2 to 4.

When $ka^2$ is 2 or more, multiple $Ma_{10}$s or $Ma_{11}$s may be the same or different.

CI represents an ion for neutralizing the electric charge and y represents a number necessary for the neutralization of electric charge.

When the two-photon absorbing compound for use in the present invention is an oxonol dye, the oxonol dye is preferably represented by formula (5).

In formula (5), $Za_5$ and $Za_6$ each represents an atomic group for forming a 5- or 6-membered ring (preferred examples are the same as those for $Za_4$) and the heterocyclic ring may be substituted (preferred examples of the substituent are the same as examples of the substituent on $Za_4$) or may be further condensed with another ring.

The ring formed by $Za_5$ and $Za_6$ is preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, more preferably barbituric acid or 2-thiobarbituric acid, and most preferably barbituric acid.

$Ma_{12}$ to $Ma_{14}$ each represents a methine group and the methine group may have a substituent (preferred examples of the substituent are the same as examples of the substituent on $Za_5$ and $Za_6$). The substituent is preferably an alkyl group, a halogen atom, a nitro group, an alkoxy group, an aryl group, a heterocyclic group, an aryloxy group, an acylamino group, a carbamoyl group, a sulfo group, a hydroxy group, a carboxy group, an alkylthio group or a cyano group, more preferably an alkyl group, a halogen atom, an alkoxy group, an aryl group, a heterocyclic group, a carbamoyl group or a carboxy group, still more preferably an alkyl group, an aryl group or a heterocyclic group.

$Ma_{12}$ to $Ma_{14}$ each is preferably an unsubstituted methine group.

$Ma_{12}$ to $Ma_{14}$ may combine with each other to form a ring and preferred examples of the ring formed include a cyclohexene ring, a cyclopentene ring, a benzene ring and a thiophene ring.

$ka^3$ represents an integer of 0 to 3, preferably 0 to 2, more preferably 1 or 2, and most preferably 2.

When $ka^3$ is 2 or more, multiple $Ma_{12}$s or $Ma_{13}$s may be the same or different.

CI represents an ion for neutralizing the electric charge and y represents a number necessary for the neutralization of electric charge.

The compound for use in the present invention is also preferably represented by formula (1).

In formula (1), $R^1$, $R^2$, $R^3$ and $R^4$ each independently represents a hydrogen atom or a substituent and the substituent is preferably an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino).

$R^1$, $R^2$, $R^3$ and $R^4$ each is preferably a hydrogen atom or an alkyl group. Some (preferably two) of $R^1$, $R^2$, $R^3$ and $R^4$ may combine with each other to form a ring. In particular, $R^1$ and $R^3$ preferably combine to form a ring and at this time, the ring formed together with the carbon atom of carbonyl is preferably a 6-, 5- or 4-membered ring, more preferably a 5- or 4-membered ring, and most preferably a 5-membered ring.

In formula (1), n and m each independently represents an integer of 0 to 4, preferably 1 to 4, but n and m are not 0 at the same time.

When n and m each is 2 or more, multiple $R^1$s, $R^2$s, $R^3$s or $R^4$s may be the same or different.

$X^1$ and $X^2$ each independently represents an aryl group [preferably having a C number of 6 to 20 and preferably a substituted aryl group (for example, a substituted phenyl group or a substituted naphthyl group and preferred examples of the substituent are the same as the substituents for $Ma_1$ to $Ma_7$), more preferably an aryl group substituted by an alkyl group, an aryl group, a heterocyclic group, a halogen atom, an amino group, a hydroxyl group, an alkoxy group, an aryloxy group or an acylamino group, still more preferably an aryl group substituted by an alkyl group, an amino group, a hydroxyl group, an alkoxy group or an acylamino group, and most preferably a phenyl group with the 4-position being substituted by a dialkylamino group or a diarylamino group; at this time, a plurality of substituents may combine to form a ring and preferred examples of the ring formed include a julolidine ring], a heterocyclic group (preferably having a C number of 1 to 20 and preferably a 3-, 4-, 5-, 6-, 7- or 8-membered ring, more preferably a 5- or 6-membered ring, for example, pyridyl, thienyl, furyl, thiazolyl, imidazolyl, pyrazolyl, pyrrolyl, indolyl, carbazolyl, phenathiazino, pyrrolidino, piperidino or morpholino with indolyl, carbazolyl, pyrrolyl and phenathiazino being preferred; the heterocyclic ring may be substituted and preferred examples of the substituent are the same as those described above for the aryl group) or a group represented by formula (2).

In formula (2), $R^5$ represents a hydrogen atom or a substituent (preferred examples are the same as those for $R^1$ to $R^4$), preferably a hydrogen atom or an alkyl group, more preferably a hydrogen atom.

$R^6$ represents a hydrogen atom, an alkyl group, an alkenyl group, an aryl group or a heterocyclic group (preferred examples of the substituent for these groups are the same as those for $R^1$ to $R^4$), preferably an alkyl group (preferably an alkyl group having a C number of 1 to 6).

$Z^1$ represents an atomic group for forming a 5- or 6-membered ring.

The heterocyclic ring formed is preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, an imidazole ring, a thiadiazole ring, a quinoline ring or a pyridine ring, more preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring or a quinoline ring, and most preferably an indolenine ring, an azaindolenine ring, a benzothiazole ring, a benzoxazole ring or a benzimidazole ring.

The heterocyclic ring formed by $Z^1$ may have a substituent (preferred examples of the substituent are the same as examples of the substituent on $Za_1$ and $Za_2$) and the substituent is more preferably an alkyl group, an aryl group, a heterocyclic group, a halogen atom, a carboxyl group, a sulfo group, an alkoxy group, a carbamoyl group or an alkoxycarbonyl group.

$X^1$ and $X^2$ each is preferably an aryl group or a group represented by formula (2), more preferably an aryl group with the 4-position being substituted by a dialkylamino group or a diarylamino group, or a group represented by formula (2).

The two-photon absorbing compound for use in the present invention preferably contains a hydrogen bonding group within the molecule. The hydrogen bonding group as used herein means a group of donating or accepting hydrogen in the hydrogen bonding, and a group having both properties of donating and accepting hydrogen is preferred.

The compound having a hydrogen bonding group for use in the present invention preferably exhibits an aggregating interaction in the solution or solid state by causing interaction between hydrogen bonding groups. The interaction may be intramolecular interaction or intermolecular interaction but is preferably intermolecular interaction.

The hydrogen bonding group for use in the present invention is preferably —COOH, —CONHR$^{11}$, —SO$_3$H, —SO$_2$NHR$^{12}$, —P(O)(OH)OR$^{13}$, —OH, —SH, —NHR$^{14}$, —NHCOR$^{15}$ or —NR$^{16}$C(O)NHR$^{17}$, wherein R$^{11}$ and R$^{12}$ each independently represents a hydrogen atom, an alkyl group (preferably having a carbon atom number (hereinafter referred to as "a C number") of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), —COR$^{18}$ or —SO$_2$R$^{19}$, and R$^{13}$ to R$^{19}$ each independently represents a hydrogen atom, an alkyl group, an alkenyl group, an aryl group or a heterocyclic group (preferred examples of these groups are the same as those for R$^{11}$ and R$^{12}$)

R$^{11}$ is preferably a hydrogen atom, an alkyl group, an aryl group, —COR$^{18}$ group or —SO$_2$R$^{19}$ group and at this time, R$^{18}$ and R$^{19}$ each is preferably an alkyl group or an aryl group.

R$^{11}$ is more preferably a hydrogen atom, an alkyl group or —SO$_2$R$^{19}$ group, and most preferably a hydrogen atom.

R$^{12}$ is preferably a hydrogen atom, an alkyl group, an aryl group, —COR$^{18}$ group or —SO$_2$R$^{19}$ group and at this time, R$^{18}$ and R$^{19}$ each is preferably an alkyl group or an aryl group.

R$^{12}$ is more preferably a hydrogen atom, an alkyl group or —COR$^{18}$ group, and most preferably a hydrogen atom.

R$^{13}$ is preferably a hydrogen atom, an alkyl group or an aryl group, more preferably a hydrogen atom.

R$^{14}$ is preferably a hydrogen atom, an alkyl group or an aryl group.

R$^{15}$ is preferably an alkyl group or an aryl group.

R$^{16}$ is preferably a hydrogen atom, and R$^{17}$ is preferably a hydrogen atom, an alkyl group or an aryl group.

The hydrogen bonding group is more preferably —COOH, —CONHR$^{11}$, —SO$_2$NHR$^{12}$, —NHCOR$^{15}$ or —NR$^{16}$C(O)NHR$^{17}$, still more preferably —COOH, —CONHR$^{11}$ or —SO$_2$NHR$^{12}$, and most preferably —COOH or —CONH$_2$.

The two-photon absorbing compound for use in the present invention may be used in the monomer state or in the aggregated state.

Incidentally, the state where dye chromophores are fixed to give a specific spatial disposition by a bonding force such as covalent bonding, coordinate bonding or various intermolecular forces (e.g., hydrogen bonding, van der Waals force, Coulomb force) is generally called an associated (or aggregated) state.

The two-photon absorbing compound for use in the present invention may be used in the intermolecular aggregation state or in a state where two or more chromophores of undergoing two-photon absorption are present within the molecule and these undergo two-photon absorption in the intramolecular aggregation state.

For reference, the aggregate is described below. The aggregate is described in detail, for example, in James (compiler), *The Theory of the Photographic Process*, 4th ed., Chap. 8, pp. 218–222, Macmillan (1977), and Takayoshi Kobayashi, *J-Aggregates*, World Scientific Publishing Co. Pte. Ltd. (1996).

The monomer means a one-molecule form. From the standpoint of the absorption wavelength of the aggregate, an aggregate where the absorption shifts to the shorter wavelength with respect to the monomer absorption is called an H-aggregate (a two-molecule form is specially called a dimer), and an aggregate where the absorption shifts to the longer wavelength is called a J-aggregate.

From the standpoint of the structure of the aggregate, in the case of a brickwork aggregate, an aggregate having a small shear angle is called a J-aggregate and an aggregate having a large shear angle is called an H-aggregate. The brickwork aggregate is described in detail in *Chemical Physics Letters*, Vol. 6, page 183 (1970). As an aggregate having a structure similar to the brickwork aggregate, an aggregate having a ladder or staircase structure is known. The aggregate having a ladder or staircase structure is described in detail in *Zeitschrift für Physikalische Chemie*, Vol. 49, page 324 (1941).

Also, as an aggregate of forming a structure other than the brickwork structure, an aggregate taking a herringbone structure is known (this aggregate can be called a herringbone aggregate).

The herringbone aggregate is described in Charles Reich, *Photographic Science and Engineering*, Vol. 18, No. 3, page 335 (1974). The herringbone aggregate has two absorption maximums attributable to the aggregate.

As described above, whether the dye is taking an aggregated state can be confirmed by the change in the absorption (absorption $\lambda$max, $\epsilon$, absorption form) from the monomer state.

The compound for use in the present invention may be shifted to shorter wavelength (H-aggregate), longer wavelength (J-aggregate) or both regions, but J-aggregate is preferred.

The intermolecular aggregation state of a compound can be formed by various methods.

For example, in the case of a solution system, a method of dissolving the compound in an aqueous solution having added thereto a matrix such as gelatin (for example, an aqueous 0.5 wt % gelatin·$10^{-4}$ M compound solution) or in an aqueous solution having added thereto a salt such as KCl (for example, an aqueous 5% KCl·$2\times10^{-3}$ M compound solution), or a method of dissolving the compound in a good solvent and then adding thereto a poor solvent (for example, DMF-water system or chloroform-toluene system) may be used.

In the case of a film system, methods such as polymer dispersion system, amorphous system, crystal system and LB film system may be used.

Furthermore, the intermolecular aggregation state may also be formed by the adsorption, chemical bonding or self-organization to a bulk or fine particle (from μm to nm size) semiconductor (for example, silver halide or titanium oxide) or to a bulk or fine particle metal (for example, gold, silver or platinum). The spectral sensitization by the J-aggregation adsorption of cyanine dye on a silver halide crystal, which is performed in the field of silver salt color photography, utilizes this technique.

As for the number of compounds participating in the intermolecular aggregation, two compounds may be used or a very large number of compounds may be used.

Specific preferred examples of the two-photon absorbing compound for use in the present invention are set forth below, however, the present invention is not limited thereto.

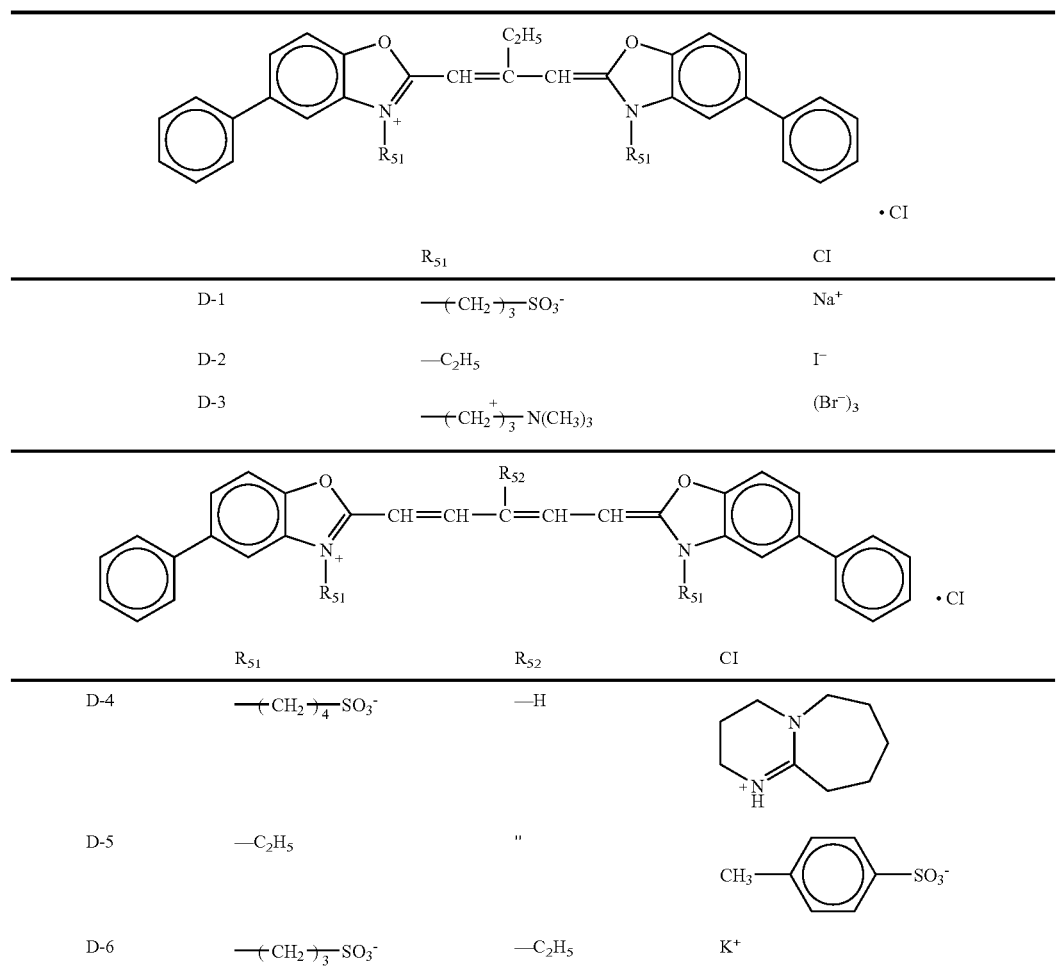

-continued

| | | | |
|---|---|---|---|
| D-7 | $-(CH_2)_3-\overset{+}{N}(CH_3)_3$ | $-CH_3$ | $(Br^-)_3$ |

D-8

[Structure: bis-benzothiazole methine dye with 5,5-dimethylcyclohexenyl bridge, 5-Cl substituents, N-(CH₂)₃SO₃⁻ groups, counterion $\overset{+}{HN}(C_2H_5)_3$]

D-9

[Structure: bis(5-chlorobenzothiazol-2-yl) trimethine dye with C₂H₅ on central carbon, N-(CH₂)₃SO₃⁻ groups, counterion $\overset{+}{HN}(C_2H_5)_3$]

D-10

[Structure: 5-chlorobenzothiazole linked via CH= to naphtho-thiazole, N-(CH₂)₃SO₃⁻ groups, counterion $\overset{+}{HN}(C_2H_5)_3$]

[Structure: 5,5'-diphenyl-2,2'-benzothiazole monomethine dye with $R_{51}$ groups on N, counterion Cl]

| | $R_{51}$ | Cl |
|---|---|---|
| D-11 | $-(CH_2)_3-SO_3^-$ | $\overset{+}{HN}(C_2H_5)_3$ |
| D-12 | $-C_2H_5$ | $CH_3-\text{C}_6H_4-SO_3^-$ |
| D-13 | $-(CH_2)_4-NH-\overset{+}{C}(NH_2)(NH_2)$ | $(Br^-)_3$ |

[Structure: bis-benzimidazole polymethine dye with C₂H₅ on one N, $R_{51}$ on other N, 5-Cl and 6-$R_{53}$ substituents, $-CH-(CH=CH)_{n51}-$ bridge, counterion Cl]

| | $R_{51}$ | $R_{53}$ | $n_{51}$ | Cl |
|---|---|---|---|---|
| D-14 | $-(CH_2)_3-SO_3^-$ | $-Cl$ | 1 | $Na^+$ |
| D-15 | $-C_2H_5$ | " | 1 | $I^-$ |
| D-16 | $-(CH_2)_4-SO_3^-$ | $-CF_3$ | " | $K^+$ |
| D-17 | " | $-CN$ | " | $\overset{+}{HN}(C_2H_5)_3$ |

-continued
| | | | | |
|---|---|---|---|---|
| D-18 | " | —Cl | 2 | 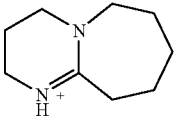 |
| D-19 | —(CH$_2$)$_3$—SO$_3^-$ | —CN | " | " |
| D-20 | —C$_2$H$_5$ | " | " |  |
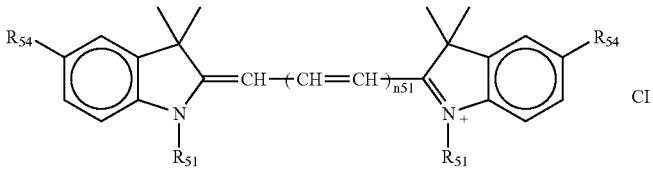
| | R$_{51}$ | R$_{54}$ | n$_{51}$ | Cl |
|---|---|---|---|---|
| D-21 | —(CH$_2$)$_3$—SO$_3^-$ | —H | 1 |  |
| D-22 | —C$_4$H$_9$ | —COOH | " |  |
| D-23 | —CH$_3$ | —H | 2 | I$^-$ |
| D-24 | —(CH$_2$)$_3$—SO$_3^-$ | —COOH | " | Na$^+$ |
| D-25 | —(CH$_2$)$_4$—SO$_3^-$ | —H | 3 | K$^+$ |
| D-26 | —(CH$_2$)$_3$—SO$_3^-$ | —COOH | " | " |
| D-27 | —CH$_3$ | —CONH$_2$ | " | 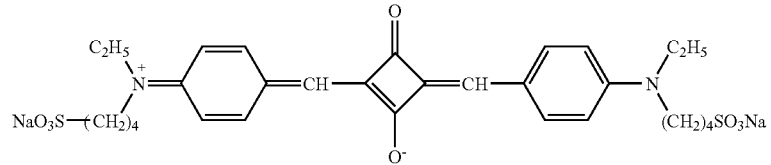 |
D-28
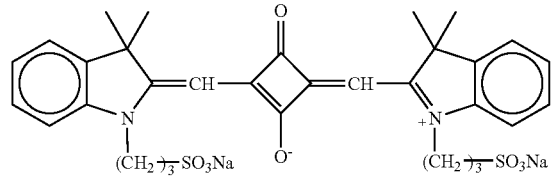
D-29
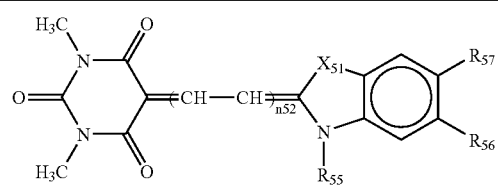

-continued

|   | $R_{55}$ | $R_{56}$ | $R_{57}$ | $X_{51}$ | $n_{52}$ |
|---|---|---|---|---|---|
| D-30 | —(CH$_2$)$_3$—SO$_3^-$ $\overset{+}{H}N(C_2H_5)_3$ | —Cl | —H | —O— | 1 |
| D-31 | —C$_2$H$_5$ | —H | —COOH | " | 2 |
| D-32 | —(CH$_2$)$_3$—$\overset{+}{N}(CH_3)_3$ Br$^-$ | —C$_6$H$_5$ | —H | " | " |
| D-33 | —(CH$_2$)$_4$—SO$_3^-$ $\overset{+}{H}N(C_2H_5)_3$ | —CH$_3$ | —CH$_3$ | —S— | " |
| D-34 | —(CH$_2$)$_3$—SO$_3^-$ $\overset{+}{H}N(C_2H_5)_3$ | —H | —H | —C(CH$_3$)$_2$— | " |
| D-35 | —CH$_3$ | " | " | " | " |
| D-36 | —(CH$_2$)$_3$—SO$_3$Na | " | —COOH | " | " |
| D-37 | —CH$_3$ | " | —CONH$_2$ | " | " |
| D-38 | —(CH$_2$)$_3$—SO$_3^-$ $\overset{+}{H}N(C_2H_5)_3$ | " | —H | " | 3 |

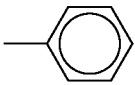

|   | $R_{55}$ | $R_{56}$ | $R_{57}$ | $X_{51}$ | $n_{52}$ |
|---|---|---|---|---|---|
| D-39 | —(CH$_2$)$_3$—SO$_3^-$ $\overset{+}{H}N(C_2H_5)_3$ | —Cl | —H | —S— | 1 |
| D-40 | —C$_2$H$_5$ | —H | —CONH$_2$ | —O— | 2 |
| D-41 | —(CH$_2$)$_4$—SO$_3^-$ $\overset{+}{H}N(C_2H_5)_3$ | —CH$_3$ | —CH$_3$ | —S— | " |
| D-42 | —(CH$_2$)$_3$—SO$_3^-$ $\overset{+}{H}N(C_2H_5)_3$ | —H | —H | —C(CH$_3$)$_2$— | " |
| D-43 | —(CH$_2$)$_3$—SO$_3$Na | " | —COOH | " | " |
| D-44 | —CH$_3$ | " | —CONH$_2$ | " | " |
| D-45 | " | " | " | " | 3 |

$Q_{51}=(CH-CH)_{n51}Q_{52}$

|   | $Q_{51}$ | $Q_{52}$ | $n_{51}$ |
|---|---|---|---|
| D-46 | NC—C(COOC$_2$H$_5$)= | [naphthothiazole with N—(CH$_2$)$_3$SO$_3^-$ $\overset{+}{H}N(C_2H_5)_3$] | 2 |

-continued
| | | | |
|---|---|---|---|
| D-47 | 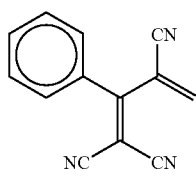 | 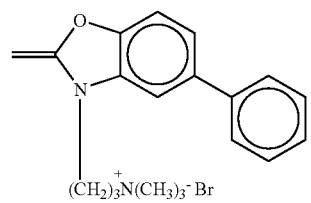 | 1 |
| D-48 | 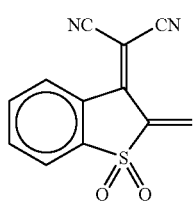 | 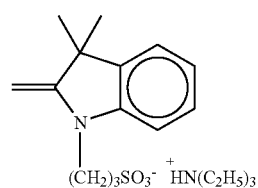 | 1 |
| D-49 | 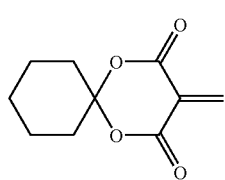 | 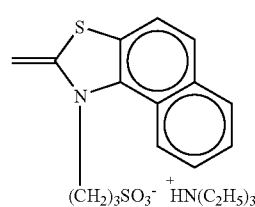 | 2 |
| D-50 | 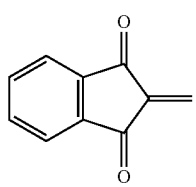 | 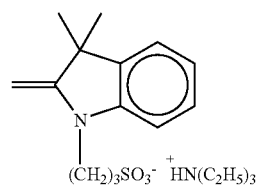 | 2 |
| D-51 | 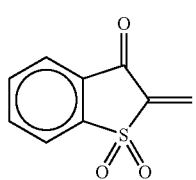 | " | 2 |
| D-52 | 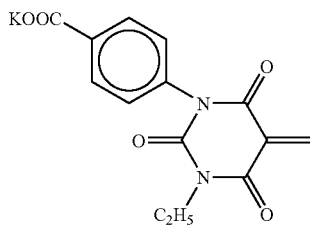 | 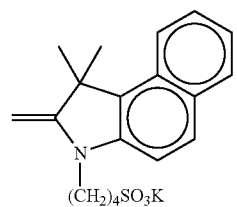 | 3 |
| D-53 | 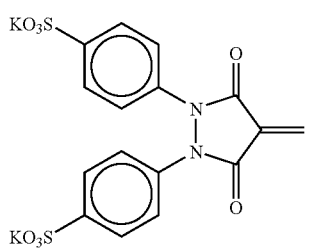 | 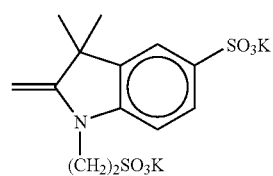 | 3 |

-continued
| | | | | |
|---|---|---|---|---|
| D-54 | 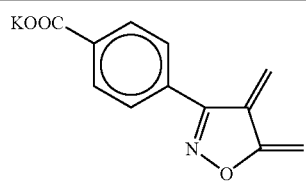 | 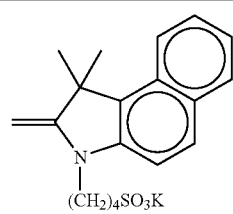 | | 3 |
| D-55 | 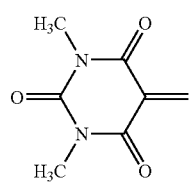 | 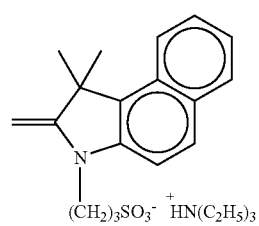 | | 2 |
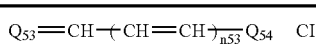
| | $Q_{53}$ | $Q_{54}$ | $n_{53}$ | Cl |
|---|---|---|---|---|
| D-56 | 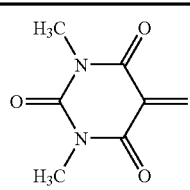 | 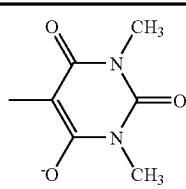 | 2 | $H^+$ |
| D-57 | 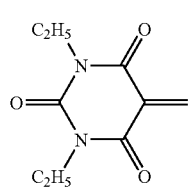 | 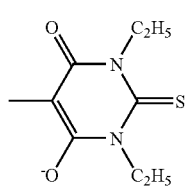 | 1 |  |
| D-58 | " | " | 2 |  |
| D-59 | 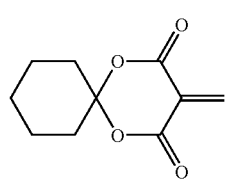 | 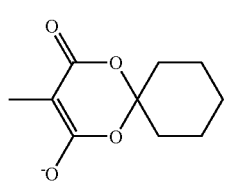 | 2 | $H^+$ |
| D-60 | 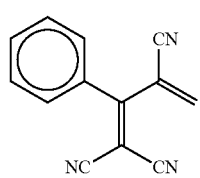 | 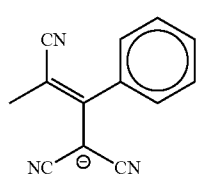 | 1 |  |
| D-61 | 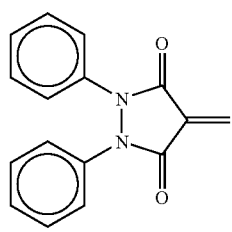 | 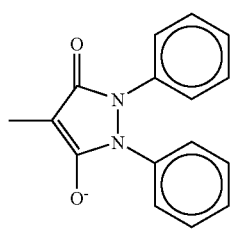 | 2 | $H^+$ |

-continued
| | | | | |
|---|---|---|---|---|
| D-62 | 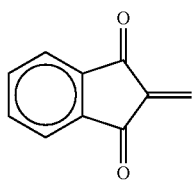 | 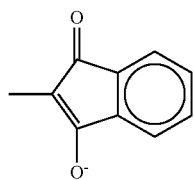 | 2 | $\overset{+}{H}N(C_2H_5)_3$ |
| D-63 | 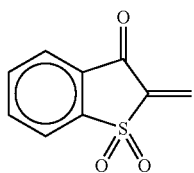 | 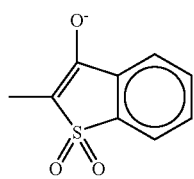 | 2 | " |
| D-64 | 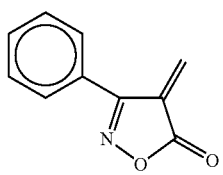 | 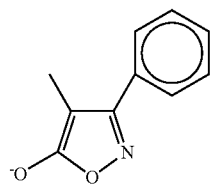 | 2 | $H^+$ |
| D-65 | 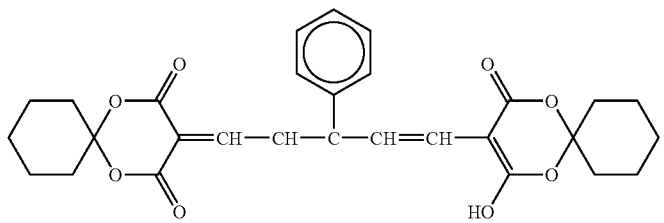 | | | |
| D-66 | 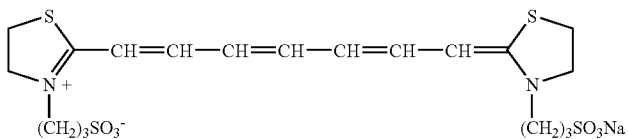 | | | |
| D-67 | 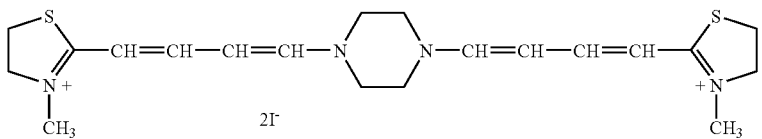 | | | |
| D-68 | 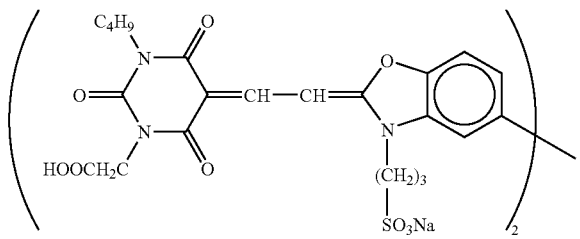 | | | |
| D-69 | 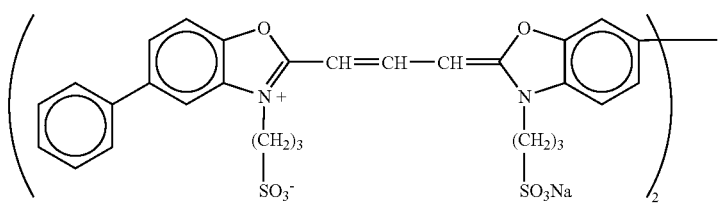 | | | |

-continued
D-70 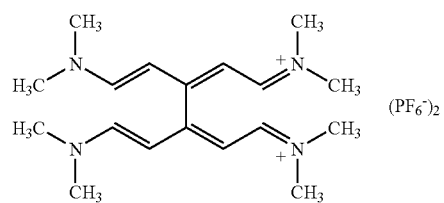 (PF$_6^-$)$_2$
D-71 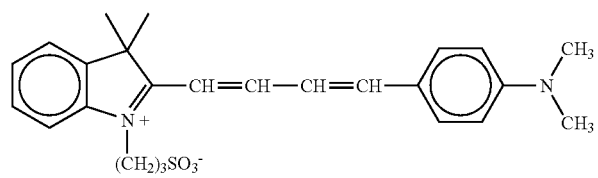
D-72 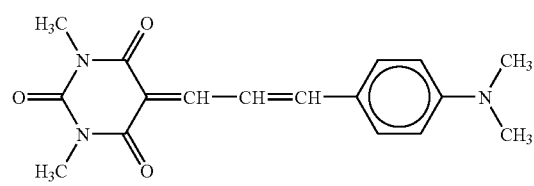
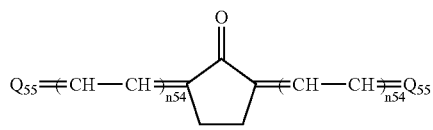
| | Q$_{55}$ | n$_{54}$ |
|---|---|---|
| D-73 | 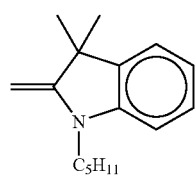 | 2 |
| D-74 | 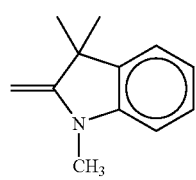 | 1 |
| D-75 | 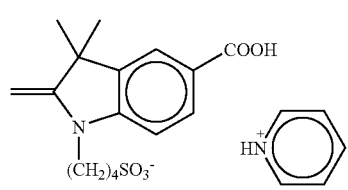 | 1 |
| D-76 | 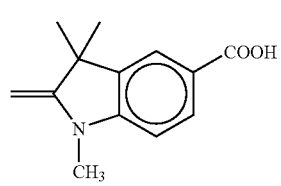 | 2 |

-continued
| | | |
|---|---|---|
| D-77 | 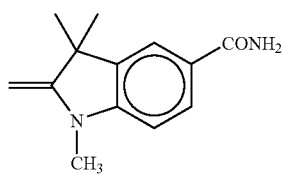 | 2 |
| D-78 | 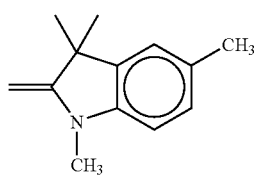 | 2 |
| D-79 | 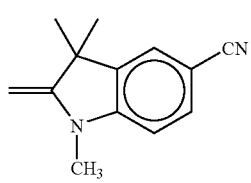 | 2 |
| D-80 | 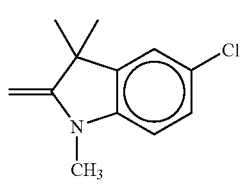 | 2 |
| D-81 | 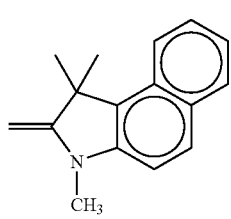 | 2 |
| D-82 | 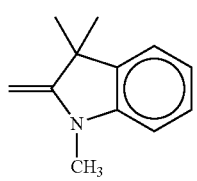 | 2 |
| D-83 | 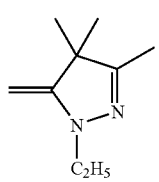 | 2 |
| D-84 | 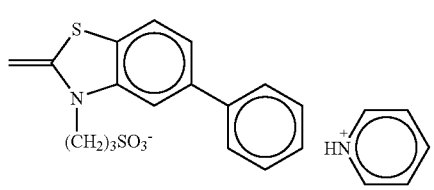 | 1 |

-continued
| | | |
|---|---|---|
| D-85 | 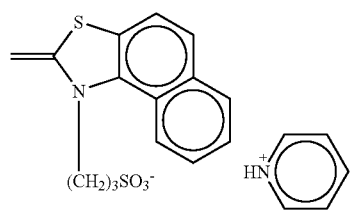 | 1 |
| D-86 | 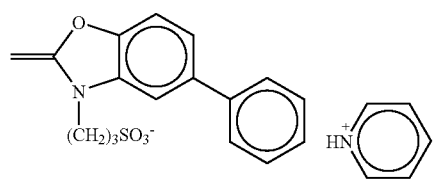 | 1 |
| D-87 | 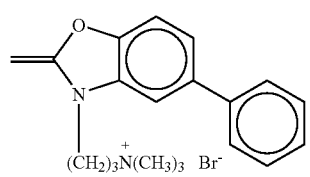 | 1 |
| D-88 | 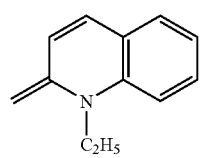 | 1 |
| D-89 | 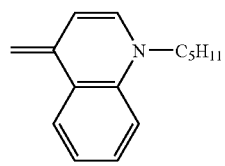 | 1 |
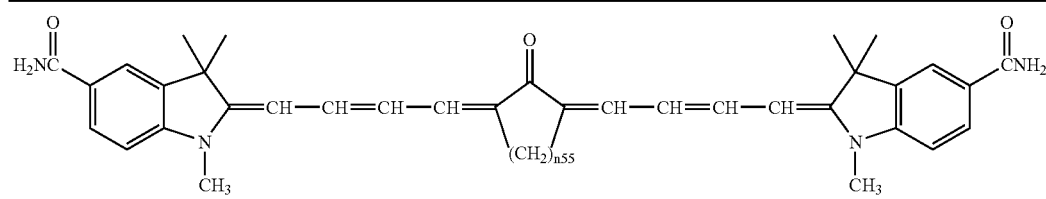
| | $n_{55}$ |
|---|---|
| D-90 | 0 |
| D-91 | 1 |
| D-92 | 3 |
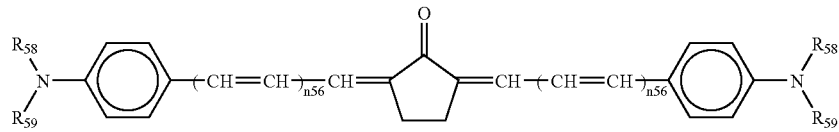
| | $R_{58}$ | $R_{59}$ | $n_{56}$ |
|---|---|---|---|
| D-93 | —$C_2H_5$ | —$C_2H_5$ | 0 |
| D-94 | —$CH_3$ | —$CH_3$ | 1 |
| D-95 | " | —$(CH_2)_3$—$SO_3Na$ | 4 |
| D-96 | " | —$CH_3$ | 2 |
| D-97 | " | —COOH | " |
| D-98 | " | —$CH_3$ | 3 |

-continued

D-93: (two phenyl groups shown) — 2

| | $n_{56}$ |
|---|---|
| D-100 | 1 |
| D-101 | 2 |
| D-102 | 3 |

| | $R_{60}$ | $n_{56}$ |
|---|---|---|
| D-103 | —$C_2H_5$ | 0 |
| D-104 | " | 1 |
| D-105 | " | 2 |
| D-106 | —$CH_2COOH$ | " |
| D-107 | —$(CH_2)_3$—$SO_3Na$ | " |

| | $n_{56}$ |
|---|---|
| D-108 | 1 |
| D-109 | 2 |

$Q_{56}$

D-110: $=CH-CH=CH-$ phenyl-$N(CH_3)_2$

-continued
D-111 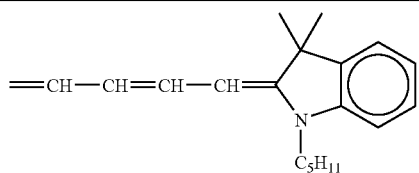
D-112 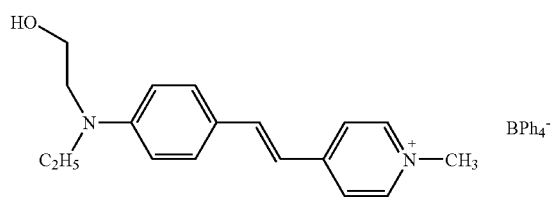
D-113 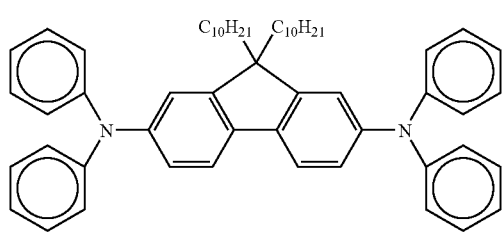
D-114 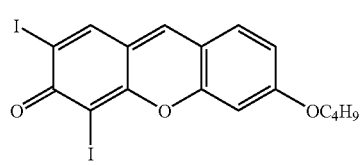
D-115 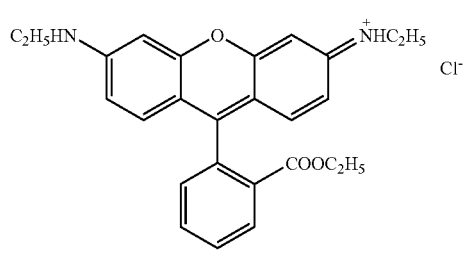
D-116 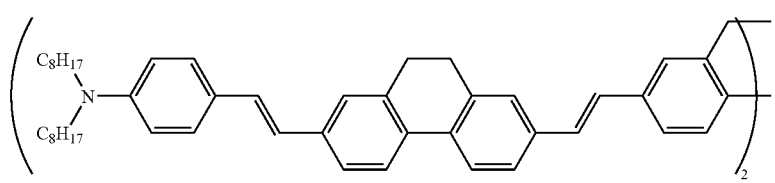
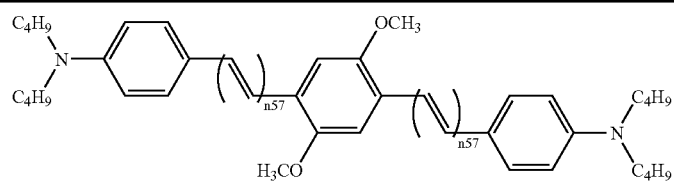
| | $n_{57}$ |
|---|---|
| D-117 | 1 |
| D-118 | 2 |

The polymerization initiator for use in the two-photon absorbing polymerizable composition of the present invention is described below.

The polymerization initiator for use in the present invention is a compound which can undergo energy transfer or electron transfer (give an electron or accept an electron) from the excited state of the two-photon absorbing compound, produced upon non-resonant two-photon absorption, to generate a radical or an acid (Brønsted acid or Lewis acid) and thereby initiate the polymerization of the polymerizable compound.

The polymerization initiator for use in the present invention is preferably a radical polymerization initiator capable of generating a radical to initiate the radical polymerization of the polymerizable compound, a cationic polymerization initiator capable of generating only an acid without generating a radical to initiate only the cationic polymerization of the polymerizable compound, or a polymerization initiator capable of generating both a radical and an acid to initiate both the radical polymerization and the cationic polymerization.

The polymerization initiator for use in the present invention preferably includes the following 14 systems. If desired, these polymerization initiators may be used as a mixture of two or more thereof which are mixed at an arbitrary ratio.

1) Ketone-base polymerization initiator
2) Organic peroxide-base polymerization initiator
3) Bisimidazole-base polymerization initiator
4) Trihalomethyl-substituted triazine-base polymerization initiator
5) Diazonium salt-base polymerization initiator
6) Diaryliodonium salt-base polymerization initiator
7) Sulfonium salt-base polymerization initiator
8) Borate-base polymerization initiator
9) Diaryliodonium organic boron complex-base polymerization initiator
10) Sulfonium organic boron complex-base polymerization initiator
11) Cationic two-photon absorbing compound organic boron complex-base polymerization initiator
12) Anionic two-photon absorbing compound onium salt complex-base polymerization initiator
13) Metal arene complex-base polymerization initiator
14) Sulfonic acid ester-base polymerization initiator These preferred systems are specifically described below.

1) Ketone-Base Polymerization Initiator

The ketone-base polymerization initiator preferably includes an aromatic ketone, aromatic diketone and the like.

Preferred examples thereof include benzophenone derivatives (e.g., benzophenone, Michler's ketone), benzoin derivatives (e.g., benzoin methyl ether, benzoin ethyl ether, α-methylbenzoin, α-allylbenzoin, α-phenylbenzoin), acetoin derivatives (e.g., acetoin, pivaloin, 2-hydroxy-2-methylpropiophenone, 1-hydroxycyclohexyl phenyl ketone), acyloin ether derivatives (e.g., diethoxyacetophenone), α-diketone derivatives (e.g., diacetyl, benzyl, 4,4'-dimethoxybenzyl, benzyldimethylketal, 2,3-bornanedione (camphor quinone), 2,2,5,5-tetramethyltetrahydro-3,4-furoic acid (imidazoletrione)), xanthene derivatives (e.g., xanthone), thioxanthone derivatives (e.g., thioxanthone, 2-chlorothioxanthone) and ketocoumarin derivatives.

Examples of the commercial product include Irgacure 184, 651 and 907 represented by the following formula, which are commercially available from Ciba Geigy.

Irgacure 907:

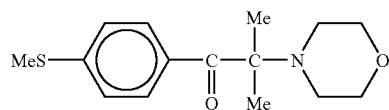

Irgacure 184:

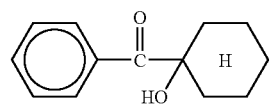

Irgacure 651:

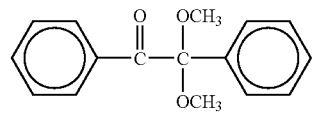

Other preferred examples include quinone-base polymerization initiators (e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-dimethylanthraquinone, sodium anthraquinone-α-sulfonate, 3-chloro-2-methylanthraquinone, retenequinone, 7,8,9,10-tetrahydronaphthacenequinone, 1,2,3,4-tetrahydrobenz(a)-anthracene-7,12-dione).

2) Organic Peroxide-Base Polymerization Initiator

Preferred examples of this system include benzoyl peroxide, di-tert-butyl peroxide, and 3,3',4,4'-tetra(tert-butylperoxycarbonyl)benzophenone described in JP-A-59-189340 and JP-A-60-76503 (the term "JP-A" as used herein means an "unexamined published Japanese patent application").

3) Bisimidazole-Base Polymerization Initiator

The bisimidazole-base polymerization initiator is preferably a bis(2,4,5-triphenyl)imidazole derivative and examples thereof include bis(2,4,5-triphenyl)imidazole, 2-(o-chlorophenyl)-4,5-bis(m-methoxyphenyl)-imidazole dimer (CDM-HABI), 1,1'-biimidazole, 2,2'-bis(o-chlorophenyl)-4,4',5,5'-tetraphenyl (o-Cl-HABI), 1H-imidazole and 2,5-bis(o-chlorophenyl)-4-[3,4-dimethoxyphenyl]-dimer (TCTM-HABI).

The bisimidazole-base polymerization initiator is preferably used together with a hydrogen donor. Preferred examples of the hydrogen donor include 2-mercapto-benzoxazole, 2-mercaptobenzothiazole and 4-methyl-4H-1,2,4-triazole-3-thiol.

4) Trihalomethyl-Substituted Triazine-Base Polymerization Initiator

The trihalomethyl-substituted triazine-base polymerization initiator is preferably represented by the following formula (11):

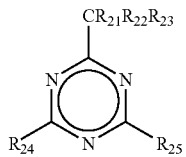
(11)

wherein $R_{21}$, $R_{22}$ and $R_{23}$ each independently represents a hydrogen atom, preferably a chlorine atom, $R_{24}$ and $R_{25}$ each independently represents a hydrogen atom, $-CR_{21}R_{22}R_{23}$ or a substituent (preferred examples are the same as the substituent on $Za^1$), $R_{24}$ is preferably $-CR_{21}R_{22}R_{23}$, more preferably $-CCl_3$, and $R_{25}$ is preferably $-CR_{21}R_{22}R_{23}$, an alkyl group, an alkenyl group or an aryl group.

Specific examples of the trihalomethyl-substituted triazine-base polymerization initiator include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4'-methoxyphenyl)-4,6-bis(trichloromethyl)-1,3,5-triazine, 2-(4'-trifluoromethylphenyl)-4,6-bis(trichloromethyl)-1,3,5-triazine, 2,4-bis(trichloromethyl)-6-(p-methoxyphenylvinyl)-1,3,5-triazine and 2-(4'-methoxy-1'-naphthyl)-4,6-bis(trichloromethyl)-1,3,5-triazine.
Preferred examples thereof also include the compounds described in British Patent 1,388,492 and JP-A-53-133428.

5) Diazonium Salt-Base Polymerization Initiator

The diazonium salt-base polymerization initiator is preferably represented by the following formula (12):

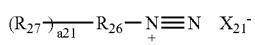
(12)

wherein $R_{26}$ represents an aryl group or a heterocyclic group (preferred examples of these groups are the same as those of the substituent on $Za^1$), preferably an aryl group, more preferably a phenyl group; $R_{27}$ represents a substituent (preferred examples are the same as those of the substituent on $Za^1$); a21 represents an integer of 0 to 5, preferably 0 to 2, and when a21 is 2 or more, multiple $R_{27}$s may be the same or different or may combine with each other to form a ring; and $X_{21}^-$ is an anion such that $HX_{21}$ becomes an acid having a pKa of 4 or less (in water, 25° C.), preferably 3 or less, more preferably 2 or less, and preferred examples thereof include chloride, bromide, iodide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulforate, benzenesulfonate, 4-trifluoromethylbenzenesulfonate and tosylate.

Specific examples of the diazonium-base polymerization initiator include the above-described $X_{21}^-$ salts of benzenediazonium, 4-methoxydiazonium and 4-methyldiazonium.

6) Diaryliodonium Salt-Base Polymerization Initiator

The diaryliodonium salt-base polymerization initiator is preferably represented by the following formula (13):

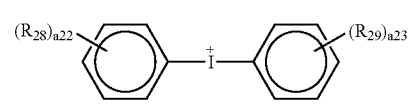
(13)

wherein $X_{21}^-$ has the same meaning as in formula (12), $R_{28}$ and $R_{29}$ each independently represents substituent (preferred examples are the same as those of the substituent on $Za^1$), preferably an alkyl group, an alkoxy group, a halogen atom, a cyano group or a nitro group, a22 and a23 each independently represents an integer of 0 to 5, preferably 0 to 1, and when a21 is 2 or more, multiple $R_{28}$s or $R_{29}$s may be the same or different and may combine with each other to form a ring.

Specific examples of the diaryliodonium salt-base polymerization initiator include chloride, bromide, iodide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulforate, benzenesulfonate, 4-trifluoomethylbenzenesulfonate and tosylate of diphenyliodonium, 4,4'-dichlorodiphenyliodonium, 4,4'-dimethoxydiphenyliodonium, 4,4'-dimethyldiphenyliodonium, 4,4'-tert-butyldiphenyliodonium, 3,3'-dinitrodiphenyliodonium, phenyl(p-methoxyphenyl)iodonium and bis(p-cyanophenyl)iodonium.

Other examples include compounds described in *Macromolecules*, Vol. 10, page 1307 (1977), and diaryliodonium salts described in JP-A-58-29803, JP-A-1-287105 and Japanese Patent Application No. 3-5569 (corresponding to JP-A-4-239505).

7) Sulfonium Salt-Base Polymerization Initiator

The sulfonium salt-base polymerization initiator is preferably represented by the following formula (14):

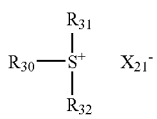
(14)

wherein $X_{21}^-$ has the same meaning as in formula (12), and $R_{30}$, $R_{31}$ and $R_{32}$ each independently represents an alkyl group, an aryl group or a heterocyclic group (preferred examples of these groups are the same as those of the substituent on $Za^1$), preferably an alkyl group, a phenacyl group or an aryl group.

Specific examples of the sulfonium salt-base polymerization initiator include chloride, bromide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulforate, benzenesulfonate, 4-trifluoomethylbenzenesulfonate and tosylate of sulfonium salts such as triphenylsulfonium, diphenylphenacylsulfonium, dimethylphenacylsulfonium, benzyl-4-hydroxyphenylmethylsulfonium, 4-tertiary-butyltriphenylsulfonium, tris(4-methylphenyl)sulfonium, tris(4-methoxyphenyl)sulfonium and 4-thiophenyltriphenylsulfonium.

8) Borate-Base Polymerization Initiator

The borate-base polymerization initiator is preferably represented by the following formula (15):

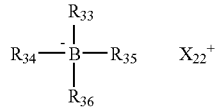

(15)

wherein $R_{33}$, $R_{34}$, $R_{35}$ and $R_{36}$ each independently represents an alkyl group, an alkenyl group, an alkynyl group, a cycloalkyl group or an aryl group (preferred examples of these groups are the same as those of the substituent on $Za^1$), preferably an alkyl group or an aryl group, provided that $R_{33}$, $R_{34}$, $R_{35}$ and $R_{36}$ are not an aryl group at the same time, and $X_{22}^+$ represents a cation.

The compound where $R_{33}$, $R_{34}$ and $R_{35}$ all are an aryl group and $R_{36}$ is an alkyl group is more preferred, and the compound where $R_{33}$, $R_{34}$ and $R_{35}$ are a phenyl group and $R_{36}$ is an n-butyl group is most preferred.

Specific examples of the borate-base polymerization initiator include tetrabutylammonium n-butyltriphenylborate and tetramethylammonium sec-butyltriphenylborate.

9) Diaryliodonium Organic Boron Complex-Base Polymerization Initiator

The diaryliodonium organic boron complex-base polymerization initiator is preferably represented by the following formula (16):

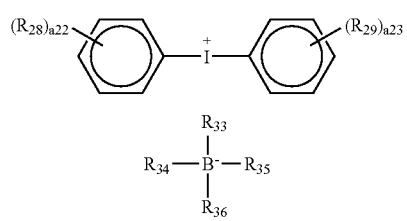

(16)

wherein $R_{28}$, $R_{29}$, a22 and a23 have the same meanings as in formula (13) and $R_{33}$, $R_{34}$, $R_{35}$ and $R_{36}$ have the same meanings as in formula (15).

Specific examples of the diaryliodonium organic boron complex-base polymerization initiator include the following I-1 to I-3.

I-1:

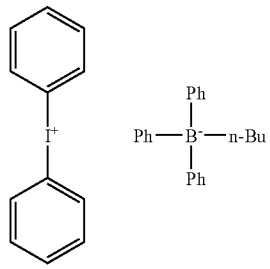

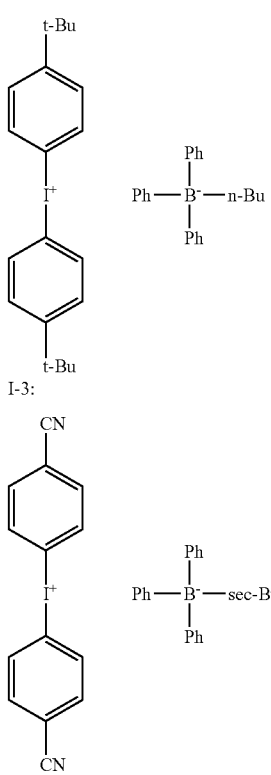

In addition, iodonium organic boron complexes such as diphenyliodonium (n-butyl)triphenylborate described in JP-A-3-704 are also preferred.

10) Sulfonium Organic Boron Complex-Base Polymerization Initiator

The sulfonium organic boron complex-base polymerization initiator is preferably represented by the following formula (17):

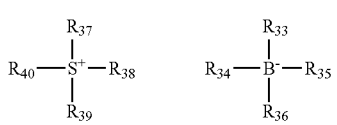

(17)

wherein $R_{33}$, $R_{34}$, $R_{35}$ and $R_{36}$ have the same meanings as in formula (15), $R_{37}$, $R_{38}$ and $R_{39}$ each independently represents an alkyl group, an aryl group, an alkenyl group, an alkynyl group, a cycloalkyl group, an alkoxy group, an aryloxy group, an alkylthio group, an arylthio group or an amino group (preferred examples of these groups are the same as those of the substituent on $Za^1$), preferably an alkyl group, a phenacyl group, an aryl group or an alkenyl group, $R_{37}$, $R_{38}$ and $R_{39}$ may combine with each other to form a ring, and $R_{40}$ represents an oxygen atom or a lone electron pair.

Specific examples of the sulfonium organic boron complex-base polymerization initiator include the following I-4 to I-10.

I-4

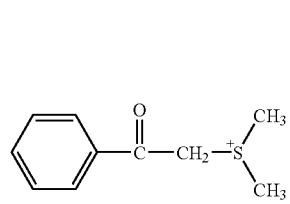 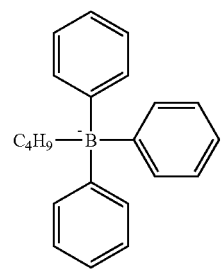

I-8

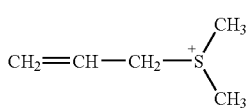 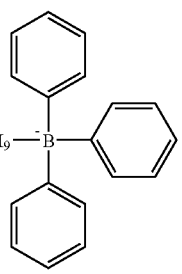

I-5

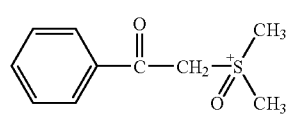 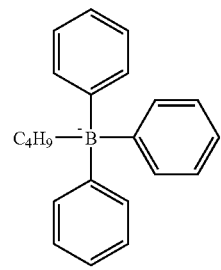

I-9

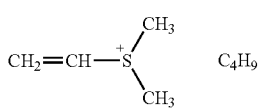

I-10

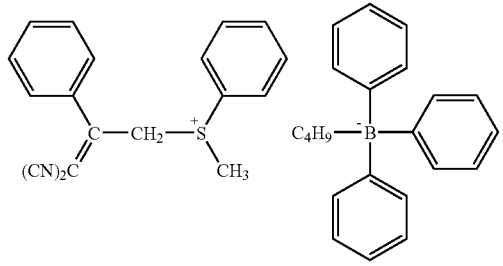

I-6

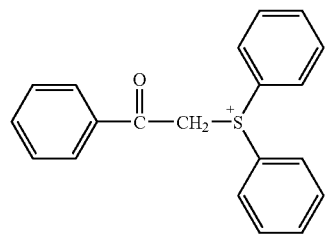

I-7

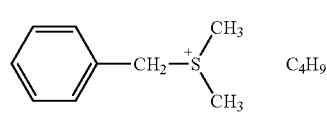 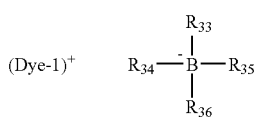

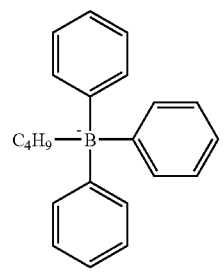

In addition, sulfonium organic boron complexes described in JP-A-5-255347 and JP-A-5-213861 are also preferred.

11) Cationic Two-Photon Absorbing Compound Organic Boron Complex-Base Polymerization Initiator When the polymerization initiator for use in the present invention is a cationic two-photon absorbing compound organic boron complex-base polymerization initiator, the cationic two-photon absorbing compound thereof may play the role of the two-photon absorbing compound for use in the present invention.

The cationic two-photon absorbing compound organic boron complex-base polymerization initiator is preferably represented by formula (18):

$$(Dy\text{-}1)^+ \quad R_{34}\text{—}\overset{R_{33}}{\underset{R_{36}}{\overset{|}{B}^-}}\text{—}R_{35} \tag{18}$$

wherein $(Dy\text{-}1)^+$ is a cationic compound of undergoing non-resonant two-photon absorption and preferred examples thereof are described above; and $R_{33}$, $R_{34}$, $R_{35}$ and $R_{36}$ have the same meanings as in formula (15).

Specific examples of the cationic two-photon absorbing compound organic boron complex-base polymerization initiator include the following I-11, I-12, I-13 and I-14.

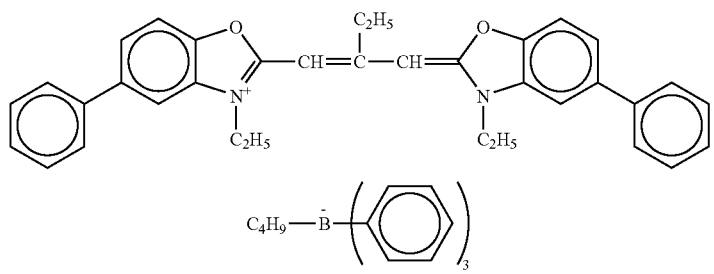
I-11
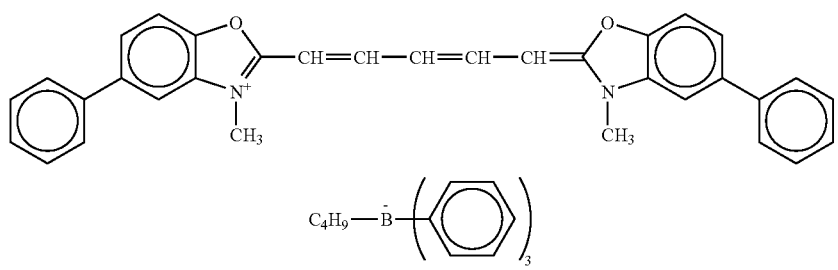
I-12
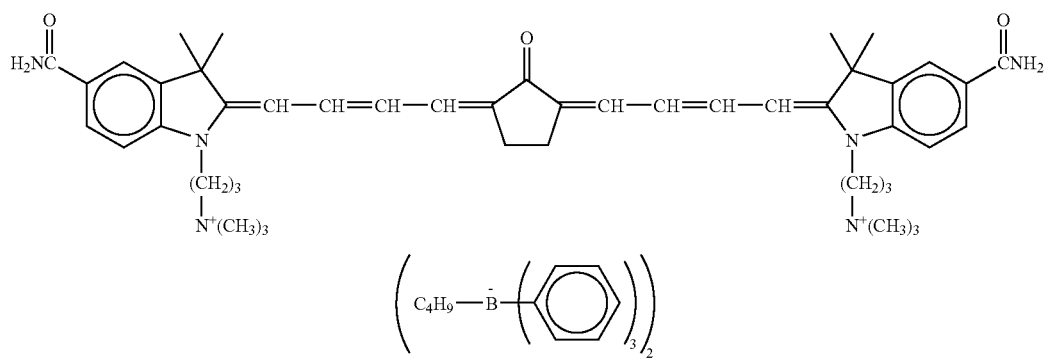
I-13
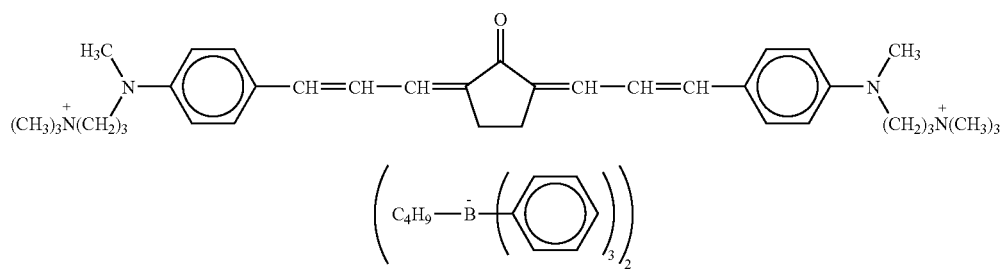
I-14

Other specific examples include cationic dye-borate anion complexes described in JP-A-62-143044 and JP-A-62-150242.

12) Anionic Two-Photon Absorbing Compound Onium Salt Complex-Base Polymerization Initiator When the polymerization initiator for use in the present invention is an anionic two-photon absorbing compound onium salt complex-base polymerization initiator, the anionic two-photon absorbing compound thereof may play the role of the two-photon absorbing compound for use in the present invention.

The anionic two-photon absorbing compound onium salt complex-base polymerization initiator is preferably represented by formula (19):

$$(Dye\text{-}2)^- X_{23}{}^+ \qquad (19)$$

wherein $(Dye\text{-}2)^-$ represents an anionic compound of undergoing non-resonant two-photon absorption and preferred examples thereof are described above; and $X_{23}{}^+$ represents a cation moiety of the diazonium salt of formula (12), a cation moiety of the diaryliodonium salt of formula (13) or a cation moiety of the sulfonium salt of formula (14) (preferred examples thereof are described above), preferably a cation moiety of the diaryliodonium salt of formula (13) or a cation moiety of the sulfonium salt of formula (14).

Specific examples of the anionic two-photon absorbing compound onium salt complex-base polymerization initiator include the following I-15 to I-32.

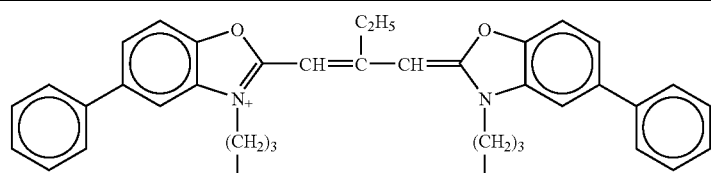

| | | |
|---|---|---|
| I-15 | 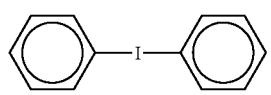 | (= C-1) |
| I-16 | 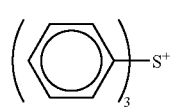 | (= C-2) |
| I-17 | 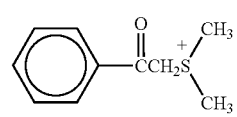 | (= C-3) |

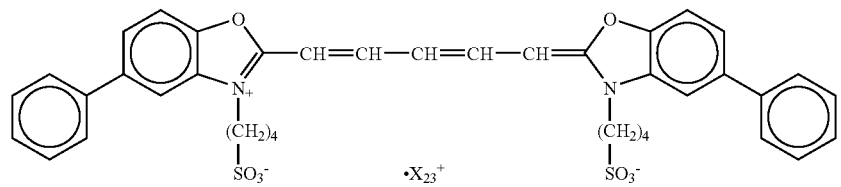

| | |
|---|---|
| I-18 | C-1 |
| I-19 | C-2 |
| I-20 | C-3 |

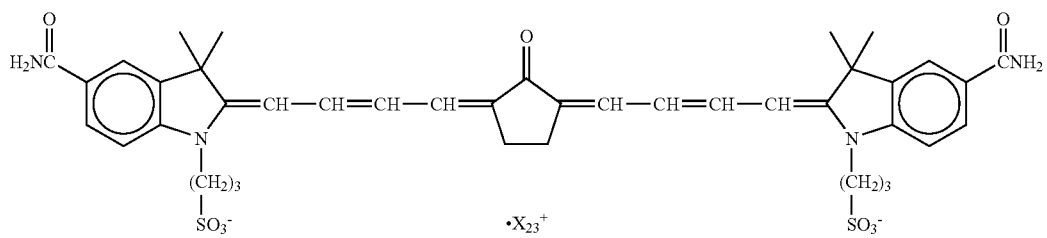

| I-21 | C-1 |
|---|---|

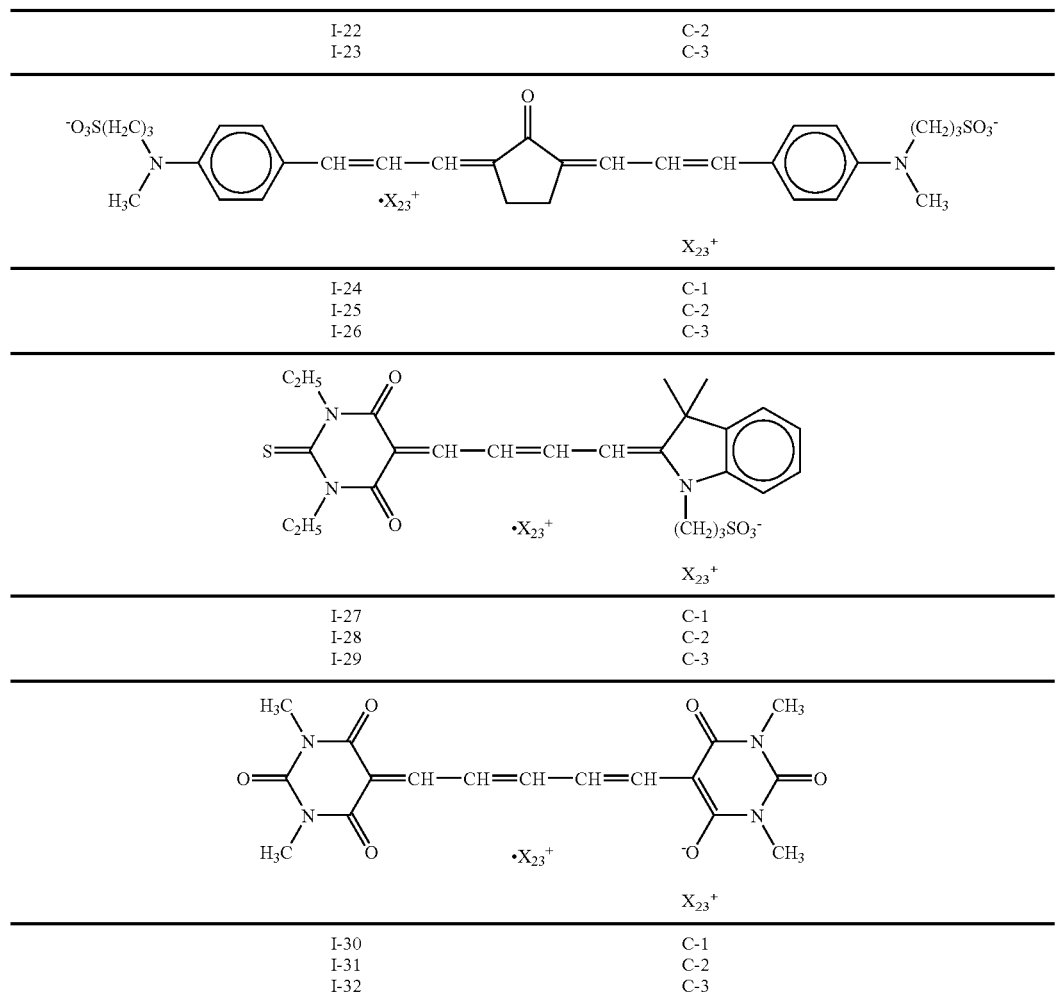

| I-22 | C-2 |
| I-23 | C-3 |

| I-24 | C-1 |
| I-25 | C-2 |
| I-26 | C-3 |

| I-27 | C-1 |
| I-28 | C-2 |
| I-29 | C-3 |

| I-30 | C-1 |
| I-31 | C-2 |
| I-32 | C-3 |

13) Metal Arene Complex-Base Polymerization Initiator

The metal arene complex-base polymerization initiator is preferably a metal, iron or titanium. Specific preferred examples thereof include iron arene complexes described in JP-A-1-54440, European Patent Nos. 109851 and 126712, and *J. Imag. Sci.*, Vol. 30, page 174 (1986), iron arene organic boron complexes described in *Organometallics*, Vol. 8, page 2737 (1989), and titanocenes described in JP-A-61-151197.

14) Sulfonic Acid Ester-Base Polymerization Initiator

Examples of the sulfonic acid ester-base polymerization initiator include a sulfonic acid ester, an imidosulfonate and a p-nitrobenzyl arylsulfonate.

Specific examples thereof include benzoin tosylate, pyrogallol trimesylate, o-nitrobenzyl tosylate, 2,5-dinitrobenzyl tosylate, N-tosylphthalimide, α-cyano-benzylidene tosylamine and p-nitrobenzyl-9,10-diethoxyanthracene-2-sulfonate.

15) Other Polymerization Initiators

Examples of the polymerization initiator other than 1) to 14) above include organic azide compounds such as 4,4'-diazide chalcone, aromatic carboxylic acids such as N-phenylglycine, polyhalogen compounds (e.g., $CI_4$, $CHI_3$, $CBrCI_3$), phenylisoxazolones, silanol aluminum complexes, and aluminate complexes described in JP-A-3-209477.

The polymerization initiators for use in the present invention can be classified into:

a) polymerization initiator capable of activating radical polymerization, b) polymerization initiator capable of activating only cationic polymerization, and c) polymerization initiator capable of activating radical polymerization and cationic polymerization at the same time.

The polymerization initiator a) capable of activating radical polymerization is a polymerization initiator capable of performing the energy transfer or electron transfer (giving an electron to the two-photon absorbing compound or accepting an electron from the two-photon absorbing compound) from the excited state of the two-photon absorbing compound, produced upon non-resonant two-photon absorption, to generate a radical and thereby initiate the radical polymerization of the polymerizable compound.

Out of the above-described systems, the following systems come under the polymerization initiator capable of activating radical polymerization:

1) ketone-base polymerization initiator, 2) organic peroxide-base polymerization initiator, 3) bisimidazole-base polymerization initiator, 4) trihalomethyl-substituted triazine-base polymerization initiator,
5) diazonium salt-base polymerization initiator,
6) diaryliodonium salt-base polymerization initiator,
7) sulfonium salt-base polymerization initiator,
8) borate-base polymerization initiator,
9) diaryliodonium organic boron complex-base polymerization initiator,
10) sulfonium organic boron complex-base polymerization initiator,
11) cationic two-photon absorbing compound organic boron complex-base polymerization initiator,
12) anionic two-photon absorbing compound onium salt complex-base polymerization initiator, and
13) metal arene complex-base polymerization initiator.

Among these polymerization initiators capable of activating radical polymerization, preferred are
1) ketone-base polymerization initiator,
3) bisimidazole-base polymerization initiator,
4) trihalomethyl-substituted triazine-base polymerization initiator,
6) diaryliodonium salt-base polymerization initiator,
7) sulfonium salt-base polymerization initiator,
11) cationic two-photon absorbing compound organic boron complex-base polymerization initiator, and
12) anionic two-photon absorbing compound onium salt complex-base polymerization initiator, and more preferred are
3) bisimidazole-base polymerization initiator,
6) diaryliodonium salt-base polymerization initiator,
7) sulfonium salt-base polymerization initiator,
11) cationic two-photon absorbing compound organic boron complex-base polymerization initiator, and
12) anionic two-photon absorbing compound onium salt complex-base polymerization initiator.

The polymerization initiator capable of activating only cationic polymerization is a polymerization initiator capable of performing the energy transfer or electron transfer from the excited state of the two-photon absorbing compound, produced upon non-resonant two-photon absorption, to generate an acid (Brønsted acid or Lewis acid) without generating a radical and thereby initiate the cationic polymerization of the polymerizable compound.

Out of the above-described systems, the following system comes under the polymerization initiator capable of activating only cationic polymerization:
14) sulfonic acid ester-base polymerization initiator.

Here, as the cationic polymerization initiator, those described, for example, in S. Peter Pappas (compiler), *UV Curing; Science and Technology*, pp. 23–76, *A Technology Marketing Publication*, and B. Klingert, M. Riediker and A. Roloff, *Comments Inorg. Chem.*, Vol. 7, No. 3, pp. 109–138 (1988) can also be used.

The polymerization initiator capable of activating radical polymerization and cationic polymerization at the same time is a polymerization initiator capable of performing the energy transfer or electron transfer from the excited state of the two-photon absorbing compound, produced upon non-resonant two-photon absorption, to generate a radical and an acid (Brønsted acid or Lewis acid) at the same time and initiate the radical polymerization of the polymerizable compound under the action of the generated radical and also the cationic polymerization of the polymerizable compound under the action of the generated acid.

Out of the above-described systems, the following systems come under the polymerization initiator capable of activating radical polymerization and cationic polymerization at the same time:
4) trihalomethyl-substituted triazine-base polymerization initiator,
5) diazonium salt-base polymerization initiator,
6) diaryliodonium salt-base polymerization initiator,
7) sulfonium salt-base polymerization initiator, and
13) metal arene complex-base polymerization initiator.

Among these polymerization initiators capable of activating radical polymerization and cationic polymerization at the same time, preferred are
6) diaryliodonium salt-base polymerization initiator, and
7) sulfonium salt-base polymerization initiator.

The polymerizable compound in the two-photon absorbing polymerizable composition of the present invention is described below.

The polymerizable compound for use in the present invention is a compound capable of causing addition polymerization under the action of a radical or an acid (Brønsted acid or Lewis acid) generated upon irradiation of light on the two-photon absorbing compound and polymerization initiator and thereby undertaking oligomerization or polymerization. The polymerizable compound for use in the present invention may be monofunctional or polyfunctional, may comprise one component or multiple components, or may be a monomer, a prepolymer (e.g., dimer, oligomer) or a mixture thereof.

The shape thereof may be a liquid form or a solid form.

The polymerizable compounds for use in the present invention are roughly classified into a polymerizable compound capable of radical polymerization (radical polymerizable compound) and a polymerizable compound capable of cationic polymerization (cationic polymerizable compound).

The radical polymerizable compound for use in the present invention is preferably a compound having at least one ethylenic unsaturated double bond within the molecule and specific examples thereof include the polymerizable monomers described below and prepolymers (e.g., dimer, oligomer) comprising such a polymerizable monomer.

A non-halogen aliphatic compound is described below. Specific examples of the monofunctional type include unsaturated acid compounds such as (meth)acrylic acid, itaconic acid and maleic acid; alkyl (meth)acrylates such as methyl (meth)acrylate, ethyl (meth)acrylate, n-butyl (meth)acrylate, tert-butyl (meth)acrylate, isobutyl (meth)acrylate, isoamyl (meth)acrylate, 2-ethylhexyl (meth)acrylate, isodecyl (meth)acrylate, 2-hydroxyethyl (meth)acrylate, 2-hydroxypropyl (meth)acrylate, 2-hydroxybutyl (meth)acrylate, 2-ethoxyethyl (meth)acrylate, 2-(2-ethoxyethoxy)ethyl (meth)acrylate, n-butoxyethyl (meth)acrylate and morpholinoethyl (meth)acrylate; alkoxyalkylene glycol (meth)acrylates such as methoxydiethy(propy)lene glycol (meth)acrylate, methoxytriethy(propy)lene glycol (meth)acrylate, methoxytetraethy(propy)lene glycol (meth)acrylate, methoxypolyethy(propy)lene glycol (meth)acrylate, ethoxydiethy(propy)lene glycol (meth)acrylate, ethoxytriethy(propy)lene glycol (meth)acrylate and ethoxypolyethy(propy)lene glycol (meth)acrylate; alicyclic (meth)acrylates such as cyclohexyl (meth)acrylate, tetrahydrofuryl (meth)acrylate, isobornyl (meth)acrylate, dicyclopentanyl (meth)acrylate, tricyclopentanyl (meth)acrylate, dicyclopentadienyl (meth)acrylate and pinanyl (meth)acrylate; amine-type (meth)acrylates such as N,N-dimethylaminoethyl (meth)acrylate, N,N-diethylaminoethyl (meth)acrylate, (meth)acrylamide and diacetone (meth)acrylate; and functional group-containing (meth)acrylates such as allyl (meth)acrylate and glycidyl (meth)acrylate.

Specific examples of the polyfunctional type include alkyl-type (meth)acrylates such as 1,3-propanediol di (meth) acrylate, 1,4-butanediol di(meth)acrylate, 1,6-hexanediol di(meth)acrylate, neopentyl glycol di(meth)acrylate, bis (acryloxyneopentyl glycol) adipate, bis(methacryloxyneopentyl glycol) adipate, epichlorohydrin-modified 1,6-hexanediol di(meth)acrylate (e.g., Kayarad R-167 produced by Nippon Kayaku Co., Ltd.), hydroxypivalic acid neopentyl glycol di(meth)acrylate and caprolactone-modified hydroxypivalic acid neopentyl glycol di(meth)acrylate (e.g., Kayarad HX series produced by Nippon Kayaku Co., Ltd.); alkylene glycol-type (meth)acrylates such as ethylene glycol di(meth)acrylate, diethylene glycol di(meth)acrylate, triethylene glycol di(meth)acrylate, tetraethylene glycol di(meth) acrylate, polyethylene glycol di(meth)acrylate, epichlorohydrin-modified ethylene glycol di(meth)acrylate (e.g., Denacol DA(M)-811 produced by Nagase & Co., Ltd.), epichlorohydrin-modified ethylene glycol di(meth)acrylate (e.g., Denacol DA(M)-851 produced by Nagase & Co., Ltd.), propylene glycol di(meth)acrylate, dipropylene glycol di(meth)acrylate, tripropylene glycol di(meth)acrylate, tetrapropylene glycol di(meth)acrylate, polypropylene glycol di (meth)acrylate and epichlorohydrin-modified propylene glycol di(meth)acrylate (e.g., DA(M)-911 produced by Nagase & Co., Ltd.); trimethylolpropane-type (meth)acrylates such as trimethylolpropane tri(meth)acrylate, ditrimethylolpropane tri(meth)acrylate, neopentyl glycol-modified trimethylolpropane di(meth)acrylate (e.g., Kayarad R-604 produced by Nippon Kayaku Co., Ltd.), ethylene oxide-modified trimethylolpropane tri(meth)acrylate (e.g., Sartomer SR-454), propylene oxide-modified trimethylolpropane tri(meth)acrylate (e.g., TPA-310 produced by Nippon Kayaku Co., Ltd.) and epichlorohydrin-modified trimethylolpropane tri(meth)acrylate (e.g., DA(M)-321 produced by Nagase & Co., Ltd.); pentaerythritol-type (meth)acrylates such as pentaerythritol tri(meth)acrylate, pentaerythritol tetra(meth)acrylate, stearic acid-modified pentaerythritol di(meth)acrylate (e.g., Aronix M-233 produced by Toagosei Chemical Industry Co., Ltd.), dipentaerythritol hexa(meth) acrylate, dipentaerythritol monohydroxypenta(meth)acrylate, alkyl-modified dipentaerythritol poly(meth)acrylates (e.g., Kayarad D-310, 320 and 330 produced by Nippon Kayaku Co., Ltd.) and caprolactone-modified dipentaerythritol poly(meth)acrylates (e.g., Kayarad DPCA-20, 30, 60 and 120 produced by Nippon Kayaku Co., Ltd.); glyceroltype (meth)acrylates such as glycerol di(meth)acrylate, epichlorohydrin-modified glycerol tri(meth)acrylate (e.g., Denacol DA(M)-314 produced by Nagase & Co., Ltd.) and triglycerol di(meth)acrylate; alicyclic (meth)acrylates such as dicyclopentanyl di(meth)acrylate, tricyclopentanyl di(meth)acrylate, cyclohexyl di(meth)acrylate, methoxylated cyclohexyl di(meth)acrylate (e.g., CAM-200 produced by Sanyo Kokusaku Pulp Co., Ltd.); and isocyanurate-type (meth)acrylates such as tris(acryloxyethyl) isocyanurate (e.g., Aronix M-315 produced Toagosei Chemical Industry Co., Ltd.)., tris(methacryloxyethyl) isocyanurate, caprolactone-modified tris(acryloxyethyl) isocyanurate and caprolactone-modified tris(methacryloxyethyl) isocyanurate.

Out of compounds comprising only an aliphatic group and having a polymerizable ethylenic unsaturated group, the compound further having a sulfur atom within the molecule is described. Examples of the monofunctional type include alkoxyalkylene glycol thio(meth)acrylates such as methoxydiethy(propy)lene glycol thio(meth)acrylate, methoxytriethy(propy)lene glycol thio(meth)acrylate, methoxytetraethy(propy)lene glycol thio(meth)acrylate, methoxypolyethy(propy)lene glycol thio(meth)acrylate, ethoxydiethy(propy)lene glycol thio(meth)acrylate, ethoxytriethy(propy)lene glycol thio(meth)acrylate and ethoxypolyethy(propy)lene glycol thio(meth)acrylate, and alicyclic thio(meth)acrylates such as cyclohexyl thio(meth)acrylate, tetrahydrofuryl thio (meth)acrylate, isobornyl thio(meth)acrylate, dicyclopentanyl thio(meth)acrylate, tricyclopentanyl thio(meth)acrylate, dicyclopentadienyl thio(meth)acrylate and pinanyl thio (meth)acrylate.

Examples of the polyfunctional type include alkyl-type thio(meth)acrylates such as 1,3-propanediol dithio (meth) acrylate, 1,4-butanediol dithio(meth)acrylate, 1,6-hexanediol dithio(meth)acrylate, neopentyl glycol dithio(meth) acrylate, bis(thioacryloxyneopentyl glycol) adipate, bis (thiomethacryloxyneopentyl glycol) adipate, epichlorohydrin-modified 1,6-hexanediol dithio(meth)acrylate, hydroxypivalic acid neopentyl glycol dithio(meth)acrylate and caprolactone-modified hydroxypivalic acid neopentyl glycol dithio(meth)acrylate, alkylene glycol-type thio (meth)acrylates such as ethylene glycol dithio(meth) acrylate, diethylene glycol dithio(meth)acrylate, triethylene glycol dithio(meth)acrylate, tetraethylene glycol dithio (meth)acrylate, polyethylene glycol dithio(meth)acrylate, epichlorohydrin-modified ethylene glycol dithio(meth)acrylate, epichlorohydrin-modified ethylene glycol dithio(meth) acrylate, propylene glycol dithio(meth)acrylate, dipropylene glycol dithio(meth)acrylate, tripropylene glycol dithio (meth)acrylate, tetrapropylene glycol dithio(meth)acrylate, polypropylene glycol dithio(meth)acrylate and epichlorohydrin-modified propylene glycol dithio(meth)acrylate; trimethylolpropane-type thio(meth)acrylates such as trimethylolpropane trithio(meth)acrylate, ditrimethylolpropane trithio(meth)acrylate, neopentyl glycol-modified trimethylolpropane dithio(meth)acrylate, ethylene oxide-modified trimethylolpropane trithio(meth)acrylate, propylene oxidemodified trimethylolpropane trithio(meth)acrylate and epichlorohydrin-modified trimethylolpropane trithio(meth) acrylate; pentaerythritol-type thio(meth)acrylates such as pentaerythritol trithio(meth)acrylate, pentaerythritol tetrathio(meth)acrylate, stearic acid-modified pentaerythritol dithio(meth)acrylate, dipentaerythritol hexathio(meth) acrylate, dipentaerythritol monohydroxypentathio(meth) acrylate, alkyl-modified dipentaerythritol polythio(meth) acrylate and caprolactone-modified dipentaerythritol polythio(meth)acrylates; glycerol-type thio(meth)acrylates such as glycerol dithio(meth)acrylate, epichlorohydrinmodified glycerol trithio(meth)acrylate and triglycerol dithio(meth)acrylate; alicyclic thio(meth)acrylates such as dicyclopentanyl dithio(meth)acrylate, tricyclopentanyl dithio (meth)acrylate, cyclohexyl dithio(meth)acrylate, methoxylated cyclohexyl dithio(meth)acrylate; and isocyanurate-type thio (meth)acrylates such as tris(thioacryloxyethyl) isocyanurate, tris(thiomethacryloxyethyl) isocyanurate, caprolactone-modified tris(thioacryloxyethyl) isocyanurate and caprolactone-modified tris(thiomethacryloxyethyl) isocyanurate. These may be used individually or as a mixture of multiple compounds.

Out of the compounds having an ethylenic unsaturated group, examples of the compound having an aromatic ring or(and) a halogen atom within the molecule include styrenes such as styrene, α-methylstyrene and 4-methoxy(or ethoxy) styrene; di- or poly-(meth)acrylate compounds such as phenyl (meth)acrylate, 4-phenylethyl (meth)acrylate, 4-methoxycarbonylphenyl (meth)acrylate, 4-ethoxycarbonylphenyl (meth)acrylate, 4-butoxycarbonylphenyl (meth)acrylate, 4-tert-butylphenyl (meth)acrylate, benzyl (meth)acrylate, phenoxy (meth)acrylate, phenoxyhydroxypropyl (meth) acrylate, 4-phenoxyethyl (meth)acrylate, 4-phenoxydiethylene glycol (meth)acrylate, 4-phenoxytetraethylene glycol (meth)acrylate, 4-phenoxyhexaethylene glycol (meth)acrylate, EO-modified phenoxylated phosphoric acid (meth) acrylate, EO-modified phthalic acid (meth)acrylate, 4-biphenylyl (meth)acrylate and aromatic polyhydroxy compounds (e.g., hydroquinone, resorcin, catechol, pyrogallol); (meth) acrylate compounds having an aromatic group, such as bisphenol A di(meth)acrylate, ethy(propy)lene oxide-modified bisphenol A di(meth)acrylate, bisphenol F di(meth) acrylate, ethy(propy)lene oxide-modified bisphenol F di(meth)acrylate, bisphenol S di(meth)acrylate, ethy(propy) lene oxide-modified bisphenol S di(meth)acrylate and epichlorohydrin-modified phthalic acid di(meth)acrylate; styrenes and (meth)acrylate compounds having an aromatic group substituted by a halogen atom having an atomic weight of chlorine or more, such as p-chlorostyrene, p-bromostyrene, p-chlorophenoxyethyl (meth)acrylate, p-bromophenoxyethyl (meth)acrylate, trichlorophenolethy (propy)lene oxide-modified (meth)acrylate, tribromophenolethy(propy)lene oxide-modified (meth)acrylate, tetrachlorobisphenol A ethy(propy)lene oxide-modified di(meth)acrylate, tetrabromobisphenol A ethy(propy)lene oxide-modified di(meth)acrylate, tetrachlorobisphenol S ethy(propy)lene oxide-modified di(meth)acrylate and tetrabromobisphenol S ethy(propy)lene oxide-modified di(meth) acrylate; vinyl compounds having a heteroaromatic group, such as N-vinylcarbazole and 3-methyl(or ethyl)-N-vinylcarbazole; and (meth)acrylate compounds substituted by a halogen atom, such as 3-chloro-2-hydroxypropyl (meth) acrylate, 3-bromo-2-hydroxypropyl (meth)acrylate, 2,3-dichloropropyl (meth)acrylate and 2,3-dibromopropyl (meth)acrylate.

Examples of the compound having an aromatic ring or(and) a halogen atom within the molecule and further having a sulfur atom within the molecule include dithio- or polythio-(meth)acrylate compounds such as phenyl thio (meth)acrylate, 4-phenylethyl thio(meth)acrylate, 4-methoxycarbonylphenyl thio(meth)acrylate, 4-ethoxycarbonylphenyl thio(meth)acrylate, 4-butoxycarbonylphenyl thio (meth)acrylate, 4-tert-butylphenyl thio(meth)acrylate, benzyl thio(meth)acrylate, 4-phenoxydiethylene glycol thio (meth)acrylate, 4-phenoxytetraethylene glycol thio(meth) acrylate, 4-phenoxyhexaethylene glycol thio(meth)acrylate, 4-biphenylyl thio(meth)acrylate and aromatic polyhydroxy compounds (e.g., hydroquinone, resorcin, catechol, pyrogallol); thio(meth)acrylate compounds having an aromatic group, such as bisphenol A dithio(meth)acrylate, ethy(propy)lene oxide-modified bisphenol A dithio(meth)acrylate, bisphenol F dithio(meth)acrylate, ethy(propy)lene oxide-modified bisphenol F dithio(meth)acrylate, bisphenol S dithio(meth)acrylate, ethy(propy)lene oxide-modified bisphenol S dithio(meth)acrylate and epichlorohydrin-modified phthalic acid dithio(meth)acrylate; thio(meth)acrylate compounds having an aromatic group substituted by a halogen atom having an atomic weight of chlorine or more, such as trichlorophenolethy(propy)lene oxide-modified thio (meth)acrylate, tribromophenolethy(propy)lene oxide-modified thio(meth)acrylate, tetrachlorobisphenol A ethy (propy)lene oxide-modified dithio(meth)acrylate, tetrabromobisphenol A ethy(propy)lene oxide-modified dithio(meth)acrylate, tetrachlorobisphenol S ethy(propy) lene oxide-modified dithio(meth)acrylate and tetrabromobisphenol S ethy(propy)lene oxide-modified dithio(meth) acrylate; and thio(meth)acrylate compounds substituted by a halogen atom, such as 3-chloro-2-hydroxypropyl thio(meth) acrylate, 3-bromo-2-hydroxypropyl thio(meth)acrylate, 2,3-dichloropropyl thio(meth)acrylate and 2,3-dibromopropyl thio(meth)acrylate.

Other examples of the compound having an ethylenic unsaturated bond include addition-polymerizable compounds of undergoing polymerization through ring-opening sigma bond cleavage. This compound is described in K. J. Ivin and T. Saegusa (compilers), Chap. 1 "General Thermodynamics and Mechanistic Aspects of Ring-Opening Polymerization, pp. 1–82, and Chap. 2 "Ring Opening Polymerization via Carbon-Carbon Sigma Bond Cleavage", pp. 83–119, Elsevier, N.Y. (1984), W. J. Bailey et al., *J. Macromol. Sci. -Chem.*, Vol. 21, pp. 1611–1639 (1984), and I. Cho and K.-D. Ahn, *J. Polym. Sci., Polym. Lett. Ed.*, Vol. 15, pp. 751–753 (1977). Specific examples thereof include vinylcyclopropanes such as 1,1-dicyano-2-vinylcyclopropane, 1,1-dichloro-2-vinylcyclopropane, diethyl 2-vinylcyclopropane-1,1-dicarboxylate (EVCD), ethyl 1-acetyl-2-vinyl-1-cyclopropane carboxylate (EAVC) and ethyl 1-benzoyl-2-vinyl-1-cyclopropane carboxylate (EBVC). These may be used individually or as a mixture of multiple compounds or may be used as a mixture with the above-described (meth)acryl compound or vinyl compound.

Specific examples of the amide monomer of an unsaturated carboxylic acid and an aliphatic polyvalent amine compound include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, xylylenebismethacrylamide, N-phenylmethacrylamide and diacetoneacrylamide.

Other examples include a polyisocyanate compound having two or more isocyanate groups per molecule described in JP-B-48-41708, and a vinyl urethane compound having two or more polymerizable vinyl groups per molecule where a hydroxy group-containing vinyl monomer represented by the formula $CH_2=C(R)COOCH_2CH(R')OH$ (wherein R and R' each represents hydrogen or a methyl group) is added.

Also, urethane acrylates described in JP-A-51-37193, and polyester acrylates and polyfunctional acrylates and methacrylates obtained from epoxy resin and (meth)acrylic acid or the like, described in JP-A-48-64183, JP-B-49-43191 and JP-B-52-30490 (the term "JP-B" as used herein means an "examined Japanese patent publication"), may be used.

Furthermore, those described as a photocurable monomer or oligomer in *Nippon Secchaku Kyokaishi* (*Journal of the Adhesion Society of Japan*), Vol. 20, No. 7, pp. 300–308 may be used.

In addition, examples of the phosphorus-containing monomer include mono(2-acryloyloxyethyl) acid phosphate (Light Ester PA, trade name, produced by Kyoeisha Chemical Co., Ltd.) and mono(2-methacryloyloxyethyl) acid phosphate (Light Ester PM, trade name, produced by Kyoeisha Chemical Co., Ltd.), and examples of the epoxy acrylate monomer include Ripoxy VR-60 (trade name, produced by Showa Highpolymer Co., Ltd.) and Ripoxy VR-90 (trade name, produced by Showa Highpolymer Co., Ltd.).

Also, NK Ester M-230G (trade name, produced by Shin-Nakamura Chemical Co., Ltd.) and NK Ester 23G (trade name, produced by Shin-Nakamura Chemical Co., Ltd.) may be used.

Furthermore, triacrylates (Aronix M-315, trade name, produced by Toa Gosei Chemical Industry Co., Ltd.; Aronix M-325, trade name, produced by Toa Gosei Chemical Industry Co., Ltd.), 2,2'-bis(4-acryloxy-diethoxyphenyl)propane (NK Ester A-BPE-4, trade name, produced by Shin-Nakamura Chemical Co., Ltd.), and tetramethylolmethane-tetraacrylate (NK Ester A-TMMT, trade name, produced by Shin-Nakamura Chemical Co., Ltd.) may be used.

As the polymerizable urethane acrylate resin, TSR-1920B, TSR-1938 (produced by Teijin Limited) and SCR-500 (produced by JSR Corporation) are preferred in view of thermal and mechanical properties.

The cationic polymerizable compound for use in the present invention is a compound of starting its polymerization under the action of an acid generated by the two-photon absorbing compound and the cationic polymerization initiator, and examples thereof include the compounds described in J. V. Crivello, *Chemtech. Oct.*, page 624 (1980), JP-A-62-149784, and *Nippon Secchaku Kyokaishi (Journal of the Adhesion Society of Japan)*, Vol. 26, No. 5, pp. 179–187 (1990).

The cationic polymerizable compound for use in the present invention is a compound having at least one oxirane ring, oxetane ring or vinyl ether group moiety within the molecule, more preferably a compound having an oxirane ring moiety.

Specifically, the cationic polymerizable compound includes the following cationic polymerizable monomers and prepolymers (e.g., dimer, oligomer) comprising such a cationic polymerizable monomer).

Specific examples of the cationic polymerizable monomer having an oxirane ring include compounds such as glycerol diglycidyl ether, glycerol triglycidyl ether, diglycerol triglycidyl ether, diglycerol polyglycidyl ether, pentaerythritol polyglycidyl ether, 1,4-bis(2,3-epoxypropoxyperfluoroisopropyl)cyclohexane, sorbitol tetraglycidyl ether, trimethylolpropane diglycidyl ether, trimethylolpropane, monoglycidyl ether, trimethylolpropane triglycidyl ether, resorcin diglycidyl ether, 1,6-hexanediol diglycidyl ether, ethylene glycol diglycidyl ether, ethylene glycol monoglycidyl ether, polyethylene glycol diglycidyl ether, propylene glycol diglycidyl ether, propylene glycol monoglycidyl ether, neopentyl glycol diglycidyl ether, neopentyl glycol monoglycidyl ether, phenyl glycidyl ether, p-tert-butylphenyl glycidyl ether, diglycidyl adipate, diglycidyl phthalate, dibromophenyl glycidyl ether, dibromoneopentyl glycol diglycidyl ether, 1,2,7,8-diepoxyoctane, 1,6-dimethylolperfluorohexanediglycidyl ether, 4,4'-bis(2,3-epoxypropoxyperfluoroisopropyl)diphenyl ether, vinylcyclohexane dioxide, 3,4-epoxycyclohexylmethyl-3',4'-epoxycyclohexane carboxylate, 3,4-epoxycyclohexyloxirane, bis(3,4-epoxycyclohexyl) adipate, bis(3,4-epoxy-6-methyl-cyclohexylmethyl) adipate, 2,2-bis[4-(2,3-epoxypropoxy)cyclohexyl]propane, 2,2-bis[4-(2,3-epoxypropoxy)cyclohexyl]hexafluoropropane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl) adipate, di-2,3-epoxycyclopentyl ether, vinyl glycidyl ether, allyl glycidyl ether, 2-ethylhexyl glycidyl ether, styrene oxide, p-bromostyrene oxide, bisphenol-A-diglycidyl ether, tetrabromobisphenol-A-diglycidyl ether and bisphenol-F-diglycidyl ether.

Also, HS-681 (produced by Asahi Denka Co., Ltd.), SOMOS8100 (produced by DMS-SOMOS), SCR-8100 series (produced by JSR Corporation), SL-7540 (produced by Vantico) and SCR-701 (produced by D-MEC Ltd. and JSR Corporation) can be used as the polymerizable epoxy-base resin.

Specific examples of the cationic polymerizable monomer having an oxetane ring include the compounds described above as specific examples of the cationic polymerizable monomers having an oxirane ring, where the oxirane ring is replaced by an oxetane ring.

Specific examples of the cationic polymerizable monomer having a vinyl ether group moiety include compounds such as vinyl-2-chloroethyl ether, vinyl-n-butyl ether, vinyl-tert-butyl ether, ethylene glycol divinyl ether, ethylene glycol monovinyl ether, propylene glycol divinyl ether, propylene glycol monovinyl ether, neopentyl glycol divinyl glycol, neopentyl glycol monovinyl glycol, glycerol divinyl ether, glycerol trivinyl ether, triethylene glycol divinyl ether, trimethylolethane trivinyl ether, trimethylolpropane monovinyl ether, trimethylolpropane divinyl ether, trimethylolpropane trivinyl ether, diglycerol trivinyl ether, sorbitol tetravinyl ether, allyl vinyl ether, 2,2-bis(4-cyclohexanol) propane divinyl ether, 2,2-bis(4-cyclohexanol)trifluoropropane divinyl ether, 1,4-cyclohexanedimethanol divinyl ether, 4-vinyl ether styrene, hydroquinone divinyl ether, phenyl vinyl ether, bisphenol A divinyl ether, tetrabromobisphenol A divinyl ether, bisphenol F divinyl ether, phenoxyethylene vinyl ether and p-bromophenoxyethylene vinyl ether.

In the two-photon absorbing polymerizable composition of the present invention, additives such as binder, chain transfer agent, heat stabilizer, plasticizer and solvent may be appropriately used, if desired.

The binder is usually used for the purpose of enhancing the film-forming property of the composition before polymerization, the uniformity of film thickness, the stability at storage, and the like. The binder preferably has good compatibility with the polymerizable compound, polymerization initiator and two-photon absorbing compound.

The binder is preferably a solvent-soluble thermoplastic polymer and these polymers can be used individually or in combination. Preferred examples thereof include:

acrylate-α-alkyl acrylate ester-acidic polymer-interpolymer (for example, a copolymer of polymethyl methacrylate, polyethyl methacrylate and methyl methacrylate with another alkyl (meth)acrylate), polyvinyl esters (e.g., polyvinyl acetate, polyvinyl acetate/acrylate, polyvinyl acetate/methacrylate, hydrolyzable polyvinyl acetate), ethylene/vinyl acetate copolymers, saturated or unsaturated polyurethanes, high molecular weight polyethylene oxides of butadiene and isoprene polymer or copolymer or polygycol having an average molecular weight of about 4,000 to 1,000,000, epoxidized products (for example, an epoxidized product having an acrylate or methacrylate group), polyamides (e.g., N-methoxymethylpolyhexamethylene adipamide), cellulose esters (e.g., cellulose acetate, cellulose acetate succinate, cellulose acetate butyrate), cellulose ethers (e.g., methyl cellulose, ethyl cellulose, ethylbenzyl cellulose), polycarbonates, polyvinyl acetals (e.g., polyvinyl butyral, polyvinyl formal), polyvinyl alcohols, polyvinylpyrrolidones, acid-containing polymers and copolymers functioning as an appropriate binder disclosed in U.S. Pat. Nos. 3,458,311 and 4,273,857, polystyrene polymers and copolymers, for example, with acrylonitrile, maleic anhydride, acrylic acid, methacrylic acid or an ester thereof, vinylidene chloride copolymers (e.g., vinylidene chloride/acrylonitrile copolymer, vinylidene chloride/methacrylate copolymer, vinylidene chloride/vinyl acetate copolymer), polyvinyl chloride or copolymers (e.g., polyvinyl chloride/acetate, vinyl chloride/acrylonitrile copolymer), polyvinylbenzal synthetic rubber (e.g., butadiene/acrylonitrile copolymer, acrylonitrile/butadiene/styrene copolymer, methacrylate/acrylonitrile/butadiene/styrene copolymer, 2-chlorobutadiene-1,3 polymer, chlorinated rubber, styrene/butadiene/styrene, styrene/isoprene/styrene block copolymer), copolyesters (for example, a polymethylene glycol of formula $HO(CH_2)_nOH$ (wherein n is an integer of 2 to 10), a copolyester produced from the reaction product of (1) hexahydroterephthalic acid, sebacic acid and terephthalic acid, (2) terephthalic acid, isophthalic acid and sebacic acid, (3) terephthalic acid and sebacic acid or (4) terephthalic acid and isophthalic acid, and a mixture of (5) the above-described glycol and a copolyester produced from (i) terephthalic acid, isophthalic acid and sebacic acid or (ii) terephthalic acid, isophthalic acid, sebacic acid and adipic acid), poly-N-vinylcarbazole and copolymers thereof, and carbazole-containing polymers disclosed in H. Kamogawa et al., *Journal of Polymer Science: Polymer Chemistry Edition*, Vol. 18, pp. 9–18 (1979).

A fluorine atom-containing polymer is also preferred as the binder. Preferred examples thereof include organic solvent-soluble polymers essentially comprising a fluoroolefin and containing, as the copolymerization component, one or more unsaturated monomer selected from an alkyl vinyl ether, an alicyclic vinyl ether, a hydroxy vinyl ether, an olefin, a haloolefin, an unsaturated carboxylic acid or an ester thereof, and a vinyl carboxylate. This organic solvent-soluble polymer preferably has a weight average molecular weight of 5,000 to 200,000 and a fluorine atom content of 5 to 70 mass %. The numeral expressed with the unit "mass %" as used herein is almost the same as the numeral expressed with the unit "% by weight".

Examples of the fluoroolefin in the fluorine atom-containing polymer include tetrafluoroethylene, chlorotrifluoroethylene, vinyl fluoride and vinylidene fluoride. Examples of the alkyl vinyl ether as the other copolymerization component include ethyl vinyl ether, isobutyl vinyl ether and n-butyl vinyl ether. Examples of the alicyclic vinyl ether include cyclohexyl vinyl ether and its derivatives. Examples of the hydroxy vinyl ether include hydroxybutyl vinyl ether. Examples of the olefin and haloolefin include ethylene, propylene, isobutylene, vinyl chloride and vinylidene chloride. Examples of the vinyl carboxylate include vinyl acetate and n-vinyl butyrate. Examples of the unsaturated carboxylic acid or an ester thereof include unsaturated carboxylic acids such as (meth)acrylic acid and crotonic acid, C1–C18 alkyl esters of (meth)acrylic acid, such as methyl (meth)acrylate, ethyl (meth)acrylate, propyl (meth)acrylate, isopropyl (meth)acrylate, butyl (meth)acrylate, hexyl (meth)acrylate, octyl (meth)acrylate and lauryl (meth)acrylate, C2–C8 hydroxyalkyl esters of (meth)acrylic acid, such as hydroxyethyl (meth)acrylate and hydroxypropyl (meth)acrylate, an N,N-dimethylaminoethyl(meth)acrylate and an N,N-diethylaminoethyl (meth)acrylate. These radical polymerizable monomers may be used individually or in combination of two or more. Furthermore, if desired, a part of the monomer may be replaced with another radical polymerizable monomer, for example, a vinyl compound such as styrene, α-methylstyrene, vinyltoluene and (meth)acrylonitrile. Also, other monomer derivatives such as carboxylic acid group-containing fluoroolefin and glycidyl group-containing vinyl ether may be used.

Specific examples of the above-described fluorine atom-containing polymer include "Lumifron" series having a hydroxyl group and being soluble in an organic solvent (for example, Lumifron LF200, weight average molecular weight: about 50,000, produced by Asahi Glass Company, Ltd.). In addition, organic solvent-soluble fluorine atom-containing polymers are commercially available from Daikin Kogyo Co., Ltd., Central Glass Co., Ltd., Penwalt and the like and these can also be used.

Generally, the ratio of each component in the two-photon absorbing polymerizable composition of the present invention is preferably in the following % range based on the entire mass of the composition.

Binder:
Preferably from 0 to 90 mass %, more preferably from 45 to 75 mass %.

Polymerizable Compound:
Preferably from 5 to 60%, more preferably from 15 to 50 mass %.

Two-Photon Absorbing Compound:
Preferably from 0.01 to 10 mass %, more preferably from 0.1 to 7 mass %.

Polymerization Initiator:
Preferably from 0.01 to 10 mass %, more preferably from 0.1 to 7 mass %.

In the two-photon absorbing polymerizable composition of the present invention, a chain transfer agent is preferably used in some cases. Preferred examples of the chain transfer agent include thiols such as 2-mercaptobenzoxazole, 2-mercaptobenzothiazole, 2-mercaptobenzimidazole, 4-methyl-4H-1,2,4-triazole-3-thiol, 4,4-thiobisbenzenethiol, p-bromobenzenethiol, thiocyanuric acid, 1,4-bis(mercaptomethyl)benzene and p-toluenethiol, thiols described in U.S. Pat. No. 4,414,312 and JP-A-64-13144, disulfides described in JP-A-2-291561, thions described in U.S. Pat. No. 3,558,322 and JP-A-64-17048, and O-acylthiohydroxamate and N-alkoxypyridine thions described in JP-A-2-291560.

Particularly, in the case where the polymerization initiator is a 2,4,5-triphenylimidazolyl dimer, a chain transfer agent is preferably used.

The amount of the chain transfer agent used is preferably from 1.0 to 30 mass % based on the entire composition.

In the two-photon absorbing polymerizable composition of the present invention, a heat stabilizer (thermal polymerization inhibitor) may be added for the purpose of preventing the polymerization during storage and maintaining the storage stability.

Useful examples of the heat stabilizer include hydroquinone, phenidone, p-methoxyphenol, alkyl or aryl-substituted hydroquinone or quinone, catechol, tert-butyl catechol, pyrogallol, 2-naphthol, 2,6-di-tert-butyl-p-cresol, phenothiazine and chloranil. Also, dinitroso dimers described in U.S. Pat. No. 4,168,982 by Pazos are useful.

The heat stabilizer is preferably added in the range from 0.001 to 5 parts by mass per 100 parts by mass of the compound having an unsaturated bond. The numeral expressed with the unit "part by mass" as used herein is almost the same as the numeral expressed with the unit "part by weight".

The plasticizer is used for varying the adhesive property, flexibility, hardness and other various mechanical properties of the two-photon polymerizable composition. Examples of the plasticizer include triethylene glycol dicaprylate, triethylene glycol bis(2-ethylhexanoate), tetraethylene glycol diheptanoate, diethyl sebacate, dibutyl suberate, tris(2-ethylhexyl)phosphate, tricresyl phosphate and dibutyl phthalate.

The two-photon absorbing polymerizable composition of the present invention may be prepared by an ordinary method, for example, by adding the above-described essential components and arbitrary components with or without a solvent.

Examples of the solvent include a ketone-base solvent such as methyl ethyl ketone, methyl isobutyl ketone, acetone and cyclohexanone, an ester-base solvent such as ethyl acetate, butyl acetate, ethylene glycol diacetate, ethyl lactate and cellosolve acetate, a hydrocarbon-base solvent such as cyclohexane, toluene and xylene, an ether-base solvent such as tetrahydrofuran, dioxane and diethyl ether, a cellosolve-base solvent such as methyl cellosolve, ethyl cellosolve, butyl cellosolve and dimethyl cellosolve, an alcohol-base solvent such as methanol, ethanol, n-propanol, 2-propanol, n-butanol and diacetone alcohol, a fluorine-base solvent such as 2,2,3,3-tetrafluoropropanol, a halogenated hydrocarbon-base solvent such as dichloromethane, chloroform and 1,2-dichloroethane, and an amide-base solvent such as N,N-dimethylformamide.

The two-photon absorbing polymerizable composition may be directly coated or spin-coated on a substrate or may be cast as a film and then laminated on a substrate by an ordinary method. The solvent used can be removed by evaporation at the drying.

The present invention is specifically described below by referring to Examples based on experimental results, however, the present invention is of course not limited to these Examples.

EXAMPLE 1

Synthesis of Two-Photon Absorbing Compound of the Invention (1) Synthesis of D-73

Two-Photon Absorbing Compound D-73 of the present invention can be synthesized by the following method.

Synthesis Example of D-73

A quaternary salt [1] (14.3 g (40 mmol)) was dissolved in 50 ml of water and thereto, 1.6 g (40 mmol) of sodium hydroxide was added. The resulting solution was stirred at room temperature for 30 minutes and the obtained reaction solution was extracted three times with ethyl acetate, dried over magnesium sulfate and then concentrated to obtain 9.2 g (yield: 100%) of the oil of methylene base [2].

Thereafter, 3.97 g (40 mmol) of dimethylaminoacrolein [3] was dissolved in 50 ml of acetonitrile and while cooling to 0° C., 6.75 g (44 mmol) of phosphorus oxychloride was added dropwise, followed by stirring at 0° C. for 10 minutes. Thereto, an acetonitrile solution containing 9.2 g of methylene base [2] was added dropwise and the resulting solution was stirred at 35° C. for 4 hours and then poured in 100 ml of ice water. After adding 16 g of sodium hydroxide, the solution was refluxed for 10 minutes, then cooled, extracted three times with ethyl acetate, dried over magnesium sulfate and concentrated. The concentrated solution was purified by silica gel column chromatography (developing solvent: ethyl acetate:hexane =1:10→1:3) to obtain 4.4 g (yield: 39%) of the oil of aldehyde [4].

Subsequently, 0.126 g (1.5 mmol) of cyclopentanone and 40.85 g (3 mmol) of aldehyde were dissolved in 30 ml of dehydrated methanol and the resulting solution was refluxed in a nitrogen atmosphere in a dark place. When the solution became uniform, 0.69 g (3.6 mmol) of a methanol solution of 28% sodium methoxide was added and the resulting solution was further refluxed for 6 hours. After cooling, the precipitated crystal was separated by filtration and washed with methanol to obtain 0.50 g (yield: 54%) of the dark green crystal of D-73. The structure was confirmed by NMR spectrum, MS spectrum and elemental analysis.

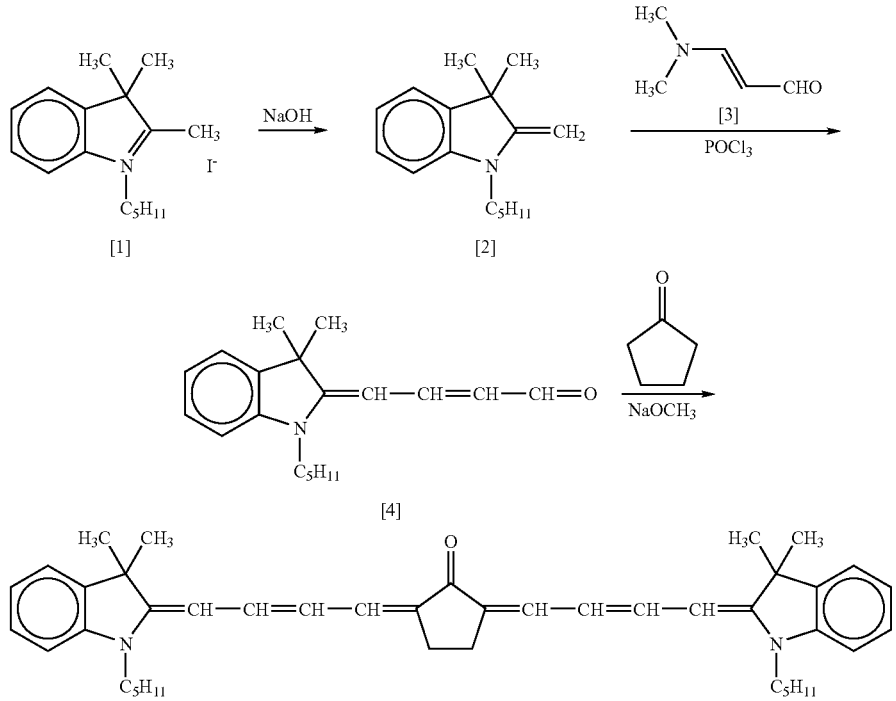

(2) Synthesis of D-84

Two-Photon Absorbing Compound D-84 of the present invention can be synthesized by the following method.

Synthesis Example of D-84:

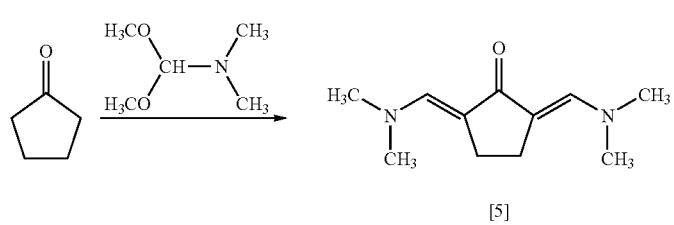

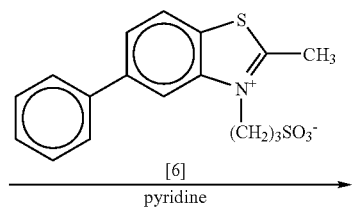

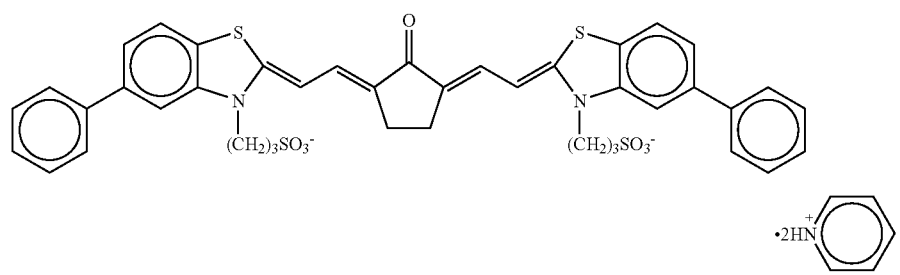

D-84

Cyclopentanone (33.6 g (0.4 mol)), 2 ml of DBN and 400 g of N,N-dimethylformamidedimethylacetal were refluxed for 5 days. The resulting solution was concentrated and after adding acetone, cooled and the crystal was separated by filtration and washed with cold acetone to obtain 32.4 g (yield: 42%) of the crystal of [5].

Thereafter, 0.78 g (4 mmol) of [5], 2.78 g (8 mmol) of a quaternary salt [6] and 20 ml of pyridine were refluxed in a nitrogen atmosphere for 4 hours in a dark place. The resulting solution was cooled and after adding ethyl acetate, the crystal was separated by filtration and washed with ethyl acetate. The crystal was dispersed in methanol and then separated by filtration to obtain 2.14 g (yield: 56%) of the dark blue crystal of objective D-84.

The structure was confirmed by NMR spectrum, MS spectrum and elemental analysis.

Other two-photon absorbing compounds represented by formula (1) of the present invention can also be synthesized according to the synthesis method of D-74 or D-84 or the method described, for example, in *Tetrahedron. Lett.*, Vol. 42, page 6129 (2001).

(3) Synthesis of D-1

Two-Photon Absorbing Compound D-1 of the present invention can be synthesized by the following method.

Synthesis Example D-1:

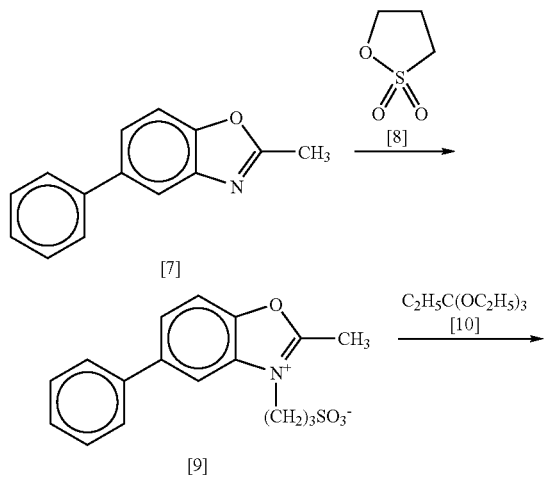

-continued

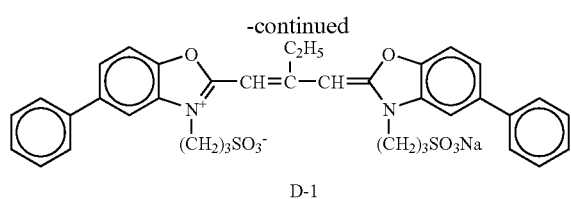

D-1

Benzoxazole [7] (52.25 g (0.3 mol) and 45.75 g (0.375 mol) of propanesultone were stirred under heating at 140° C. for 4 hours. After cooling, acetone was added and the crystal was separated by filtration and washed with acetone to obtain 70.42 g (yield: 85%) of a quaternary salt [9].

Thereafter, 66.2 g (0.2 mol) of the quaternary salt [9], 200 ml of triethyl orthopropionate [10], 200 ml of pyridine and 80 ml of acetic acid were stirred under heating at 120° C. for 1 hour. After cooling, the resulting solution was washed by decantation three times with ethyl acetate, then dissolved in 100 ml of methanol and stirred. Thereto, a solution of 4.0 g (50 mmol) of sodium acetate/20 ml of methanol was added and the produced crystal was separated by filtration, then dispersed in methanol and further separated by filtration to obtain 31.36 g (yield: 43.4%) of the vermilion crystal of objective D-1.

The structure was confirmed by NMR spectrum, MS spectrum and elemental analysis.

(4) Synthesis of D-42

Two-Photon Absorbing Compound D-42 of the present invention can be synthesized by the following method.

Synthesis Example D-42:

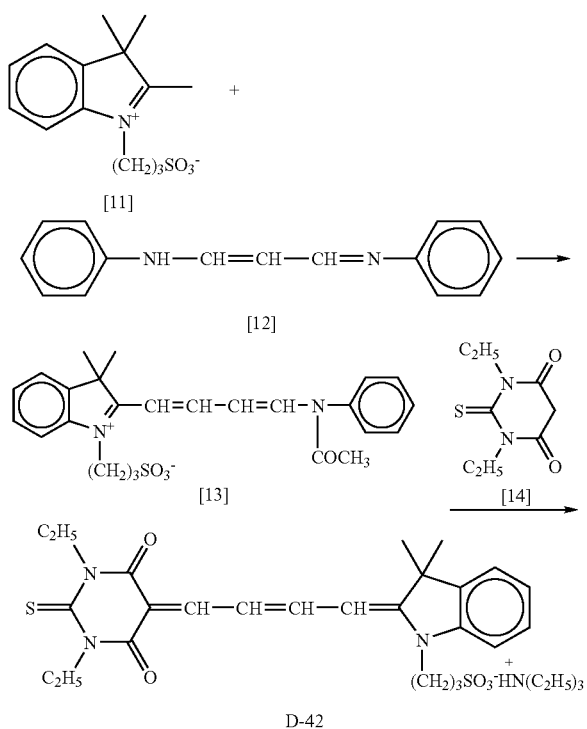

D-42

A quaternary salt [11] (2.81 g (10 mmol)), 6.67 g (30 mmol) of [12], 10 g of acetic anhydride and 50 ml of acetonitrile were refluxed for 30 minutes. The resulting solution was concentrated and then decanted with ethyl acetate to obtain a crude product of anil form [13].

Thereafter, 2.00 g (10 mmol) of a barbituric acid [14], 3.0 g (30 mmol) of triethylamine and 100 ml of ethanol were added to the crude product of anil form [13] and the resulting solution was refluxed for 1 hour. After concentration, the concentrated solution was purified by silica gel column chromatography (developing solvent: chloroform:methanol=20:1→10:1) and further recrystallized from methanol-isopropyl alcohol to obtain 2.55 g (total yield: 41.3%) of the crystal of objective D-42.

The structure was confirmed by NMR spectrum, MS spectrum and elemental analysis.

(5) Synthesis of D-56

Two-Photon Absorbing Compound D-56 of the present invention can be synthesized by the following method.

Synthesis Example D-56:

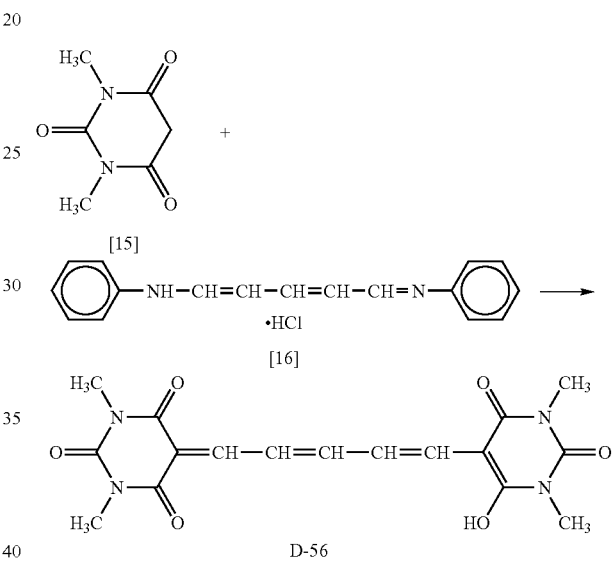

D-56

A barbituric acid [15] (3.12 g (20 mmol)), 2.85 g (10 mmol) of [16] and 4.1 g (40 mmol) of triethylamine were dissolved in 30 ml of DMF and the resulting solution was stirred at room temperature for 2 hours. Thereafter, dilute hydrochloric acid was added and the produced crystal was separated by filtration, washed with water and dried to obtain 2.99 g (yield: 80.0%) of the crystal of objective D-56.

The structure was confirmed by NMR spectrum, MS spectrum and elemental analysis.

Other cyanine dyes, merocyanine dyes, oxonol dyes and the like can also be synthesized according to the method described, for example, in F. M. Harmer, *Heterocyclic Compounds—Cyanine Dyes and Related Compounds*, John Wiley & Sons, New York, London (1964), and D. M. Sturmer, *Heterocyclic Compounds—Special Topics in Heterocyclic Chemistry*, Chap. 18, Section 14, pp. 482–515, John Wiley & Sons, New York, London (1977).

However, the synthesis method of the two-photon absorbing compound for use in the present invention is not limited thereto.

The polymerization initiator, polymerizable compound, binder, chain transfer agent, heat stabilizer, plasticizer, solvent and the like for use in the present invention are mostly available on the market and the commercially available products can be used as it is.

EXAMPLE 2

Evaluation of Polymerization Sensitivity of Two-Photon Absorbing Polymerizable Composition (not using Polymerization Initiator)

The two-photon absorbing polymerization process of the present invention is described below. As for the laser light source used, a laser ray at a wavelength being longer than the linear absorption band of the two-photon absorbing compound for use in the present invention and not having linear absorption is used. More specifically, a solid or fiber laser having an oscillation wavelength in the vicinity of the center wavelength of 1,000 nm, a semiconductor, solid or fiber laser having an oscillation wavelength in the vicinity of 780 nm, or a semiconductor or solid laser having an oscillation wavelength in the range from 620 to 680 nm, and the like can be used.

Samples 101 to 106 of the two-photon absorbing polymerizable composition (not using a polymerization initiator) of the present invention and Comparative Sample 1 using the two-photon absorbing compound described in Non-Patent Document 1 were prepared. The composition of each sample is shown below.

<Sample 101: Two-Photon Absorbing Polymerizable Composition of the Present Invention>

Two-photon absorbing compound: D-73, 5.0 mg (8 μmol)

Polymerizable compound:
SCR-701 (epoxy-base) produced by D-MEC Ltd., 1.0 g
Solvent: chloroform, 1 ml <Comparative Sample 1>

Two-photon absorbing compound:
Compound 9 (R-1) described in Non-Patent Document 1, 5.2 mg (8 μmol)

Polymerizable compound:
SCR-701 (epoxy-base) produced by D-MEC Ltd., 1.0 g
Solvent: chloroform, 1 ml Compound 9 described in Non-Patent Document 1:

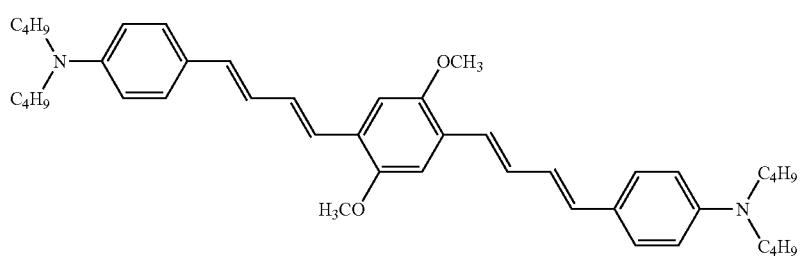

R-1

Samples 102 to 106 were prepared by replacing the two-photon absorbing compound of Sample 101 of the present invention with an equimolar amount of D-77, D-86, D-4, D-42 and D-56, respectively. The sample was dripped on a preparation glass plate and after drying the solvent, a cover glass was placed thereon to obtain a sample for evaluation.

In the performance evaluation of the two-photon absorbing polymerizable composition of the present invention, a Ti:sapphire pulse laser (pulse width: 100 fs, repetition: 80 MHz, average output: 1 W, peak power: 100 kW) capable of performing the measurement in the wavelength range from 700 to 1,000 nm was used and the two-photon absorbing polymerizable composition of the present invention was irradiated with the laser light converged by an NA0.6 lens. The curing of the two-photon absorbing polymerizable composition was confirmed by detecting the change in the refractive index due to polymerization of the resin. The minimum laser power necessary for the curing of the two-photon absorbing polymerizable composition of the present invention was estimated by performing two-photon absorbing polymerization while variously changing the irradiation power and irradiation time of the laser light irradiated.

The polymerization sensitivity was evaluated from the minimum laser power necessary for the curing of the two-photon absorbing polymerizable composition of the present invention estimated by the above-described method, and the relative sensitivity when the minimum laser power of the two-photon absorbing polymerizable composition of Comparative Example 1 was taken as 1 is shown in Table 1. In each sample, the value at the irradiation wavelength with a smallest laser power was used for the relative sensitivity.

TABLE 1

| Two-Photon Absorbing Polymerizable Composition | Two-Photon Absorbing Compound | Polymerization Relative Sensitivity | Remarks |
|---|---|---|---|
| Sample 101 | D-73 | 16 | Invention |
| Sample 102 | D-77 | 30 | " |
| Sample 103 | D-86 | 15 | " |
| Sample 104 | D-4 | 28 | " |
| Sample 105 | D-42 | 16 | " |
| Sample 106 | D-56 | 27 | " |
| Comparative Sample 1 | R-1 | 1 | Comparison |

As apparent from Table 1, in the two-photon absorbing polymerizable composition comprising a two-photon absorbing compound and a polymerizable compound, the polymerizable composition using the highly efficient two-photon absorbing compound of the present invention has two-photon polymerization sensitivity by far higher than that of the polymerizable composition using a known two-photon absorbing compound.

Incidentally, when the polymerizable compound was replaced by an equivalent mass of urethane acrylate-base SCR-500 or TSR-1920B produced by JSR Corporation and the relative sensitivity was determined in the same manner, the polymerizable composition using the highly efficient two-photon absorbing compound of the present invention was also revealed to have two-photon polymerization sensitivity by far higher than that of the polymerizable composition using a known two-photon absorbing compound.

EXAMPLE 3

Evaluation of Polymerization Sensitivity of Two-Photon Absorbing Polymerizable Composition (using Polymerization Initiator, Radical Polymerization)

Samples 201 to 211 of the two-photon absorbing polymerizable composition (using a polymerization initiator) of the present invention and Comparative Sample 2 using the two-photon absorbing compound described in Non-Patent Document 1 were prepared. The composition of each sample is shown below.

<Sample 201: Two-Photon Absorbing Polymerizable Composition of the Present Invention>

Two-photon absorbing compound: D-94, 3.2 mg (8 μmol)

Polymerizable compound:
　SCR-500 (urethane acrylate-base) produced by JSR Corporation, 1.0 g Polymerization initiator: I-51, 30 mg (70 μmol)

Solvent: chloroform, 1 ml

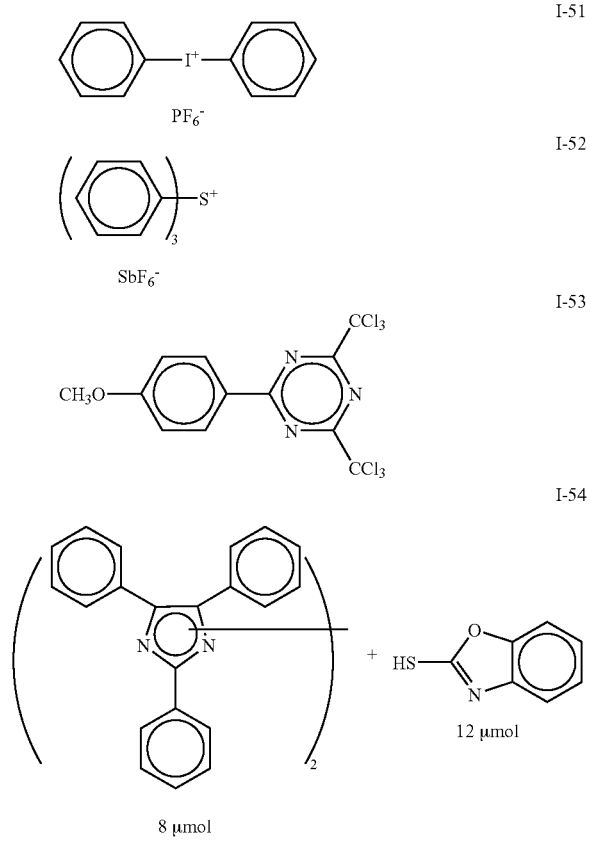

Samples 202 to 208 were prepared by replacing the two-photon absorbing compound and polymerization initiator of Sample 201 of the present invention with equimolar amounts of the two-photon absorbing compound and the polymerization initiator shown in Table 2.

<Sample 209: Two-Photon Absorbing Polymerizable Composition of the Present Invention>

Two-photon absorbing compound serving also as polymerization initiator: I-12, 0.63 mg (8 μmol)

Polymerizable compound:
　SCR-500 (urethane acrylate-base) produced by JSR Corporation, 1.0 g Solvent: chloroform, 1 ml Samples 210 to 211 were prepared by replacing the two-photon absorbing compound serving also as a polymerization initiator of Sample 209 of the present invention with an equimolar amount of the compound shown in Table 2.

<Comparative Sample 2>

Two-photon absorbing compound:
　Compound 9 (R-1) described in Non-Patent Document 1, 5.2 mg (8 μmol)

Polymerizable compound:
　SCR-500 (urethane acrylate-base) produced by JSR Corporation, 1.0 g Polymerization initiator: I-51, 30 mg (70 μmol)

Solvent: chloroform, 1 ml

Samples 201 to 211 of the two-photon absorbing polymerizable composition (using a polymerization initiator) of the present invention and Comparative Sample 2 using the two-photon absorbing compound described in Non-Patent Document 1 were determined on the relative sensitivity in the same manner as in Example 2. The results are shown in Table 2.

TABLE 2

| Two-Photon Absorbing Polymerizable Composition | Two-Photon Absorbing Compound | Polymerization Initiator | Polymerization Relative Sensitivity | Remarks |
|---|---|---|---|---|
| Sample 201 | D-94 | I-51 | 5 | Invention |
| 202 | D-77 | I-54 | 45 | " |
| 203 | D-73 | I-52 | 15 | " |
| 204 | " | I-4 | 24 | " |
| 205 | D-86 | I-53 | 18 | " |
| 206 | D-4 | I-54 | 81 | " |
| 207 | D-42 | I-1 | 40 | " |
| 208 | D-56 | I-54 | 76 | " |
| 209 | | I-12 | 92 | " |
| 210 | | I-18 | 88 | " |
| 211 | | I-32 | 83 | " |
| Comparative Sample 2 | R-1 | I-51 | 1 | Comparison |

As apparent from Table 2, in the two-photon absorbing polymerizable composition comprising a two-photon absorbing compound, a polymerization initiator and a polymerizable compound, the polymerizable composition using the highly efficient two-photon absorbing compound of the present invention has two-photon radical polymerization sensitivity by far higher than that of the polymerizable composition using a known two-photon absorbing compound.

EXAMPLE 4

Evaluation of Polymerization Sensitivity of Two-Photon Absorbing Polymerizable Composition (using Polymerization Initiator, Cationic Polymerization)

Samples 301 to 304 of the two-photon absorbing polymerizable composition (using a polymerization initiator) of the present invention and Comparative Sample 3 using the two-photon absorbing compound described in Non-Patent Document 1 were prepared. The composition of each sample is shown below.

<Sample 301: Two-Photon Absorbing Polymerizable Composition of the Present Invention>

Two-photon absorbing compound: D-94, 3.2 mg (8 μmol)

Polymerizable compound:
SCR-701 (epoxy-base) produced by D-MEC Ltd., 1.0 g

Polymerization initiator: I-51, 30 mg (70 μmol)

Solvent: chloroform, 1 ml

Samples 302 to 304 were prepared by replacing the two-photon absorbing compound and polymerization initiator of Sample 301 of the present invention with equimolar amounts of the two-photon absorbing compound and the polymerization initiator shown in Table 3.

<Comparative Sample 3>

Two-photon absorbing compound:
Compound 9 (R-1) described in Non-Patent Document 1, 5.2 mg (8 μmol)

Polymerizable compound:
SCR-701 (epoxy-base) produced by D-MEC Ltd., 1.0 g

Polymerization initiator: I-51, 30 mg (70 μmol)

Solvent: chloroform, 1 ml

Samples 301 to 304 of the two-photon absorbing polymerizable composition (using a polymerization initiator) of the present invention and Comparative Sample 3 using the two-photon absorbing compound described in Non-Patent Document 1 were determined on the relative sensitivity in the same manner as in Example 2. The results are shown in Table 3.

TABLE 3

| Two-Photon Absorbing Polymerizable Composition | Two-Photon Absorbing Compound | Polymerization Initiator | Polymerization Relative Sensitivity | Remarks |
|---|---|---|---|---|
| Sample 301 | D-94 | I-51 | 4 | Invention |
| 302 | D-77 | I-52 | 20 | " |
| 303 | D-4 | I-53 | 32 | " |
| 304 | D-56 | I-52 | 31 | " |
| Comparative Sample 3 | R-1 | I-51 | 1 | Comparison |

As apparent from Table 3, in the two-photon absorbing polymerizable composition comprising a two-photon absorbing compound, a polymerization initiator and a polymerizable compound, the polymerizable composition using the highly efficient two-photon absorbing compound of the present invention has two-photon cationic polymerization sensitivity by far higher than that of the polymerizable composition using a known two-photon absorbing compound.

By using the two-photon absorbing polymerizable composition of the present invention, photopolymerization can be brought about upon non-linear two-photon absorption with a sensitivity by far higher than that attainable by conventional compositions.

While the invention has been described in detail and with reference to specific embodiments thereof, it will be apparent to one skilled in the art that various changes and modifications can be made therein without departing from the spirit and scope thereof.

What is claimed is:

1. A two-photon absorbing polymerizable composition comprising at least a two-photon absorbing compound, a polymerization initiator and a polymerizable compound, said composition being photopolymerizable upon non-resonant two-photon absorption, wherein said two-photon absorbing compound is a cyanine dye represented by the following formula (3), a merocyanine dye represented by the following formula (4), an oxonol dye represented by the following formula (5) or a dye compound represented by the following formula (1):

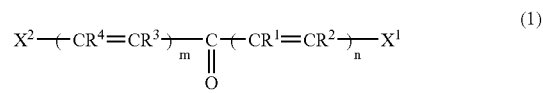

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, the plurality of $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

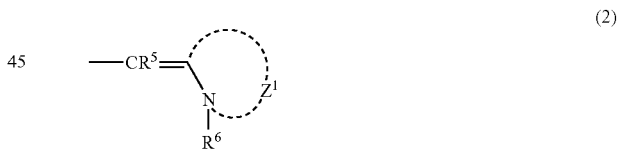

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring;

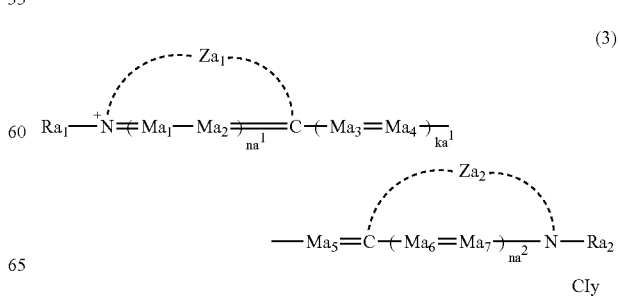

-continued

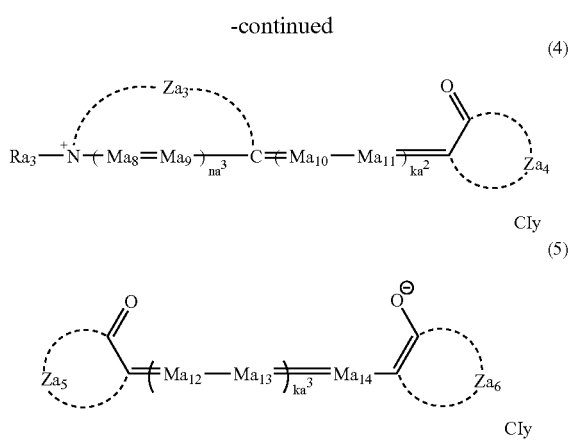

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

2. The two-photon absorbing polymerizable composition as claimed in claim 1, wherein in the compound represented by formula (1), $X^1$ and $X^2$ each is a group represented by formula (2).

3. The two-photon absorbing polymerizable composition as claimed in claim 1, wherein the polymerization initiator is 1) ketone containing polymerization initiator, 2) an organic peroxide containing polymerization initiator, 3) a bisimidazole containing polymerization initiator, 4) a trihalomethyl-substituted triazine containing polymerization initiator, 5) a diazonium salt containing polymerization initiator, 6) a diaryliodonium salt containing polymerization initiator, 7) a sulfonium salt containing polymerization initiator, 8) a triphenylalkylborate containing polymerization initiator, 9) a diaryliodonium organic boron complex containing polymerization initiator, 10) a sulfonium organic boron complex containing polymerization initiator, 11) a cationic two-photon absorbing and organic boron complex containing polymerization initiator, 12) an anionic two-photon absorbing and onium salt complex containing polymerization initiator, 13) a metal arene complex containing polymerization initiator or 14) a sulfonic acid ester-base polymerization initiator.

4. The two-photon absorbing polymerizable composition as claimed in claim 1, wherein the polymerization initiator contains a polymerization initiator capable of generating at least one radical and the polymerizable compound contains a radical polymerizable compound capable of undergoing polymerization under the action of at least one radical.

5. The two-photon absorbing polymerizable composition as claimed in claim 1, wherein the polymerization initiator contains a polymerization initiator capable of generating an acid without generating at least one radical and the polymerizable compound contains a cationic polymerizable compound capable of undergoing polymerization under the action of at least one acid.

6. The two-photon absorbing polymerizable composition as claimed in claim 1, wherein the polymerization initiator contains a polymerization initiator capable of generating both at least one radical and at least one acid and the polymerizable compound contains either one or both of a radical polymerizable compound capable of undergoing polymerization under the action of at least one radical and a cationic polymerizable compound capable of undergoing polymerization under the action of at least one acid.

7. A polymerization process comprising irradiating the two-photon absorbing polymerizable composition claimed in claim 1 with a laser ray at a wavelength being longer than the linear absorption band of the two-photon absorbing compound and not having linear absorption, and causing a polymerization reaction by using the two-photon absorption induced.

8. A three-dimensional optical recording medium comprising the two-photon absorbing polymerizable composition claimed in claim 1.

9. A stereolithography composition comprising the two-photon absorbing polymerizable composition claimed in claim 1.

10. A two-photon absorbing polymerizable composition comprising at least a two-photon absorbing compound and a polymerizable compound, said composition being photopolymerizable upon non-resonant two-photon absorption, wherein said two-photon absorbing compound is a cyanine dye represented by the following formula (3), a merocyanine dye represented by the following formula (4), an oxonol dye represented by the following formula (5) or a dye compound represented by the following formula (1):

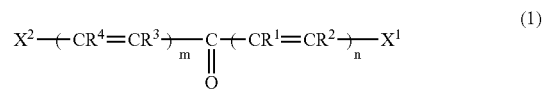

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, the plurality of $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

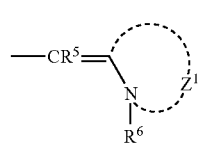

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring;

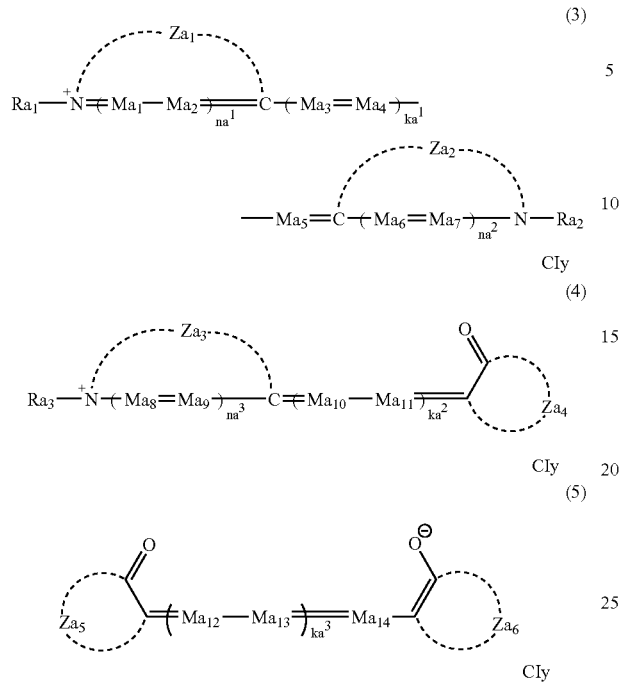

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

11. The two-photon absorbing polymerizable composition as claimed in claim 10, wherein in the compound represented by formula (1) $X^1$ and $X^2$ each is a group represented by formula (2).

12. A polymerization process comprising irradiating the two-photon absorbing polymerizable composition claimed in claim 10 with a laser ray at a wavelength being longer than the linear absorption band of the two-photon absorbing compound and not having linear absorption, and causing a polymerization reaction by using the two-photon absorption induced.

13. A three-dimensional optical recording medium comprising the two-photon absorbing polymerizable composition claimed in claim 10.

14. A stereolithography composition comprising the two-photon absorbing polymerizable composition claimed in claim 10.

15. A two-photon absorbing polymerizable composition comprising at least two-photon absorbing compound, a polymerization initiator and a polymerizable compound, said composition being photopolymerizable upon non-resonant two-photon absorption, wherein the polymerization initiator is 1) an organic peroxide containing polymerization initiator, 2) a bisimidazole containing polymerization initiator, 3) a trihalomethyl-substituted triazine containing polymerization initiator, 4) a diazonium salt containing polymerization initiator, 5) a sulfonium salt containing polymerization initiator, 6) a borate containing polymerization initiator, 7) a diaryliodonium organic boron complex containing polymerization initiator, 8) a sulfonium organic boron complex containing polymerization initiator, 9) a cationic two-photon absorbing compound organic boron complex containing polymerization initiator, 10) an anionic two-photon absorbing compound onium salt complex containing polymerization initiator, 11) a metal arene complex containing polymerization initiator or 12) a sulfonic acid ester-base polymerization initiator and wherein said two-photon absorbing compound is a cyanine dye represented by the following formula (3), a merocyanine dye represented by the following formula (4), an oxonol dye represented by the following formula (5) or a dye compound represented by the following formula (1):

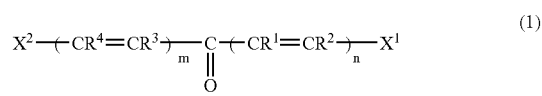

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, the plurality of $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring;

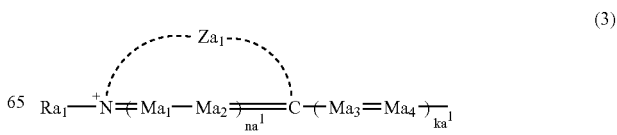

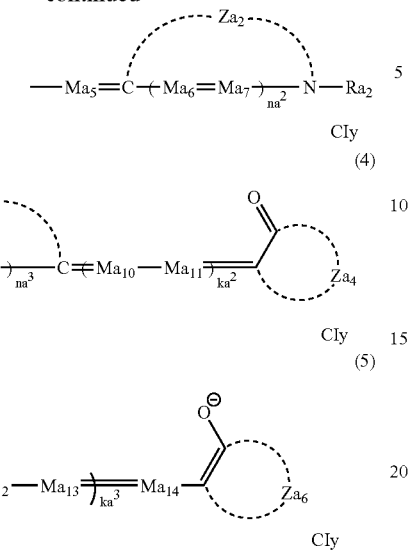

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$, and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

\* \* \* \* \*